US007049004B2

(12) United States Patent
Domash et al.

(10) Patent No.: US 7,049,004 B2
(45) Date of Patent: May 23, 2006

(54) INDEX TUNABLE THIN FILM INTERFERENCE COATINGS

(75) Inventors: Lawrence H. Domash, Conway, MA (US); Eugene Ma, Chestnut Hill, MA (US); Robert Murano, Melrose, MA (US); Nikolay Nemchuk, North Andover, MA (US); Adam Payne, Atlanta, GA (US); Steven Sherman, Boston, MA (US); Matthias Wagner, Cambridge, MA (US); Ming Wu, Arlington, MA (US)

(73) Assignee: Aegis Semiconductor, Inc., Woburn, MA (US)

( * ) Notice: Subject to any disclaimer, the term of this patent is extended or adjusted under 35 U.S.C. 154(b) by 0 days.

(21) Appl. No.: 10/666,974

(22) Filed: Sep. 19, 2003

(65) Prior Publication Data

US 2004/0062945 A1 Apr. 1, 2004

Related U.S. Application Data

(63) Continuation-in-part of application No. 10/174,503, filed on Jun. 17, 2002, now abandoned.

(60) Provisional application No. 60/364,485, filed on Mar. 15, 2002, provisional application No. 60/322,208, filed on Sep. 14, 2001, provisional application No. 60/310,047, filed on Aug. 4, 2001, provisional application No. 60/309,704, filed on Aug. 2, 2001, provisional application No. 60/298,820, filed on Jun. 18, 2001.

(51) Int. Cl.
*B32B 9/04* (2006.01)
*G02B 1/00* (2006.01)

(52) U.S. Cl. .............. 428/446; 428/641; 428/622; 428/687; 428/620; 428/912.2; 359/788; 359/582; 359/584; 359/586

(58) Field of Classification Search ............... 428/620, 428/641, 622, 687, 446, 912.2; 359/788, 359/582, 584, 586
See application file for complete search history.

(56) References Cited

U.S. PATENT DOCUMENTS

| | | | |
|---|---|---|---|
| 4,929,063 A | 5/1990 | Durand et al. | 350/353 |
| 5,037,169 A | 8/1991 | Chun | 385/16 |
| 5,218,422 A | 6/1993 | Zoechbauer | 356/352 |
| 5,408,319 A | 4/1995 | Halbout et al. | 356/352 |
| 5,515,460 A | 5/1996 | Stone | 385/24 |
| 5,619,059 A | 4/1997 | Li et al. | 257/431 |
| 6,018,421 A | 1/2000 | Cushing | 359/589 |
| 6,194,721 B1 | 2/2001 | Bly | |
| 2002/0080493 A1* | 6/2002 | Tsai et al. | 359/584 |
| 2002/0191268 A1 | 12/2002 | Seeser et al. | |

FOREIGN PATENT DOCUMENTS

| | | |
|---|---|---|
| DE | 44 24 717 A1 | 1/1996 |
| EP | 0 773 640 A2 | 5/1997 |
| EP | 1055959 A2 | 11/2000 |
| WO | WO 00/13350 | 3/2000 |
| WO | WO 00/22479 | 4/2000 |

OTHER PUBLICATIONS

Augustine, B.H. et al. "Thermal-optical switching of a silicon based interference filter" *J. Appl. Phys.* (Feb. 15, 1994): 75(04) 1875-1877.

Niemi, T. et al. "Tunable Silicon Etalon for Simultaneous Spectral Filtering and Wavelength Monitoring of a DWDM Transmitter." *IEEE Photonics Technology Letters* (Jan. 2001) 13(1) 58-60.

Cocorullo, G. et al. "Amorphous silicon based waveguides and light modulators for silicon low-cost photonic integrated circuits." *MRS Fall Meeting Boston* (Dec. 1997).

Cocorullo, G. et al. "Amorphous silicon Waveguides and Interferometers for Low-Cost Silicon Optoelectronics." *SPIE* (1998): 3278, 286-292.

Cocorullo, G. et al, "Amorphous silicon waveguides and light modulators for integrated photonics realized by low-temperature plasma-enhanced chemical-vapor deposition." *Optics Letters* (Dec. 15, 1996): 21(4) 2002-2004.

Cocorullo, G. et al. "Amorphous Silicon-Based Guided-Wave Passive and Active Devices for Silicon Integrated Optoelectronics." *IEEE Journal of Selected Topics in Quantum Electronics* ( Nov./Dec. 1998): 4(6) 997-1002.

Cocorullo, G. et al. "Fast infrared light modulation in a Si:H micro-devices for fiber-to-the-home applications." *Journal of Non-Crystalline Solids* (2000) 1247-1251.

Cocorullo, G. et al. "Silicon Thermooptical Micromodular with 700-KHz-3-dB Bandwidth." *IEEE Photonics Technology Letters* (Apr. 1995): 7(4) 363-365.

Cocorullo, G. et al. "Thermo-Optical Modulation at $\lambda$=1.5 $\mu$m in an $\alpha$-SiC-$\alpha$-Si-$\alpha$SiC Planar Guided-Wave Structure." *IEEE Photonics Technology Letters* (Jul. 1996): 8(7) 900-902.

Coppola, G. et al. "Simulation and analysis of a high-efficiency silicon optoelectronic modulator based on a Bragg mirror." *Society of Photo-optical Instrumentation Engineers* (Jun. 2001): 40(6) 1076-1081.

(Continued)

*Primary Examiner*—Ling Xu
(74) *Attorney, Agent, or Firm*—Kurt Rauschenbach; Rauschenbach Patent Law Group, LLC

(57) ABSTRACT

According to various embodiments and aspects of the present invention, there is provided a dynamically tunable thin film interference coating including one or more layers with thermo-optically tunable refractive index. Tunable layers within thin film interference coatings enable a new family of thin film active devices for the filtering, control, modulation of light. Active thin film structures can be used directly or integrated into a variety of photonic subsystems to make tunable lasers, tunable add-drop filters for fiber optic telecommunications, tunable polarizers, tunable dispersion compensation filters, and many other devices.

4 Claims, 17 Drawing Sheets

OTHER PUBLICATIONS

Della Corte, F. et al. "Study of the thermo-optic effect in hydrogenated amorphous silicon and hydrogenated amorphous silicon carbide between 300 and 500 K at: 1.55 μm." *Applied Physics Letters* (Jul. 9, 2001): 79(2) 168-170.

Eicker, U. et al. "Optical bistability in amorphous Si-C alloys and amorphous alloy interference filters." *Optical Society of America* (1991): 8(3), 614-617.

Iodice, M. et al. "Simple and low-cost technique for wavelength division multiplexing channel monitoring." *Society of Photo-Optical Instrumentation Engineers* (Jun. 2000): 69(6) 1704-1711.

Martinu, L. et al. "Plasma deposition of optical films and coatings: A review." *J. Vac. Sci. Technol.* (Nov./Dec 2000): A18(6), 2619-2645.

Parmentier, F. et al. "Towards Tunable Optical Filters." *Technical Digest, OSA Topical Meeting Optical Interference Coatings* (Jul. 15 2001) Paper WB1.

Carbunescu, E. "Non linear optical effects in hydrogenated amorphous silicon." *Optical Engineering*, May 1996, pp. 1322-132435(05).

Kajava T. et al., "Tuanable fabry-perot micro-filters for telecommunication system diagnostics." Tech Dig. Conf. Lasers and Elctro-Optics Cleo/Europe (1998) p. 324.

* cited by examiner

US 7,049,004 B2

INDEX TUNABLE THIN FILM INTERFERENCE COATINGS

This application is a divisional of U.S. patent application Ser. No. 10/174,503, filed on Jun. 17, 2002, now abandoned, which claims benefit of U.S. Provisional Patent Application Nos. 60/298,820, filed on Jun. 18, 2001; 60/309,704, filed on Aug. 2, 2001; 60/322,208, filed on Sep. 14, 2001; and 60/364,485, filed on Mar. 15, 2002.

BACKGROUND

The following background discusses three general areas of technology, including thin films interference coatings, thin film filters, and the thermo-optic characteristics of semiconductors and their use in photonic devices.

Thin Film Interference Coatings

Thin film interference coatings (TFIC) represent one of the most mature and widely applied aspects of optical technology. In general, TFIC depends on the deposition of a sequence of one or several (up to hundreds) of thin films, generally transparent over the wavelengths of intended use, with varying refractive indices and other properties in order to obtain desired properties of spectral reflectance and transmittivity, phase shift, or polarization over a given spectral band. For example, anti-reflection coatings have been applied to lenses for almost a century. Other applications of TFIC include narrow bandpass filters, polarizers, color filters, and many others. It is known to the art that a very wide range of optical characteristics can be designed into TFIC, given a sufficient array of starting materials with different indices. Numerous computer simulation and designs tools exist, for example ThinFilm Calc by Spectral Sciences. Widely used deposition processes for TFIC include physical vapor deposition methods such as sputtering or e-beam evaporation. While TFIC are used throughout the field of optics, modern application of TFIC to demanding requirements such as those of the wavelength-division multiplexed (WDM) fiber optic communications industry has become very sophisticated. Using multiple-cavity (up to seven or more) resonantor designs and hundreds of layers, filters with very precise flat-top, steep-sided characteristics are now available that enable small WDM channel spacings (50 GHz or 25 GHz). Other such filters are designed not for their transmission filtering properties but for their spectral distribution of phase delay characteristics over a range of wavelengths, offering precise pulse dispersion or group delay characteristics relevant to high bit-rate networks. TFIC which function as narrowband filters of various kinds will be denoted thin film interference filters, TFIF.

Modern surveys of the field of TFIC in general and TFIF specifically can be found in the following references, as well as numerous journals.

A. Thelen, Design of Optical Interference Coatings, McGraw-Hill, 1989.
J. D. Rancourt, Optical Thin Film Users' Handbook, Macmillan, 1996.
H. A. MacLeod, Thin Film Optical Filters, Second Edn. Macmillan, 1986.
J. A. Dobrowolski, Coatings and Filters, Sect. 8, Handbook of Optics, Second Edn. McGraw-Hill, 1995.
Proceedings of the 2001 OSA Topical Conference on Optical Interference Coatings, July, 2001, Banff, Optical Soc. America.

Since the properties of TFIC are strongly dependent on the refractive indices of the component films, it would be highly desirable to develop "active" thin film materials with controllable or tunable index for TFIC. However, the requirements for such materials are manifold and stringent. To be useful candidates for active thin films, the material would have to offer very low absorption loss and low scattering at the wavelength of interest (as one example, the fiber optic network communications wavelength band near 1.5 µm), be practical for direct thin film deposition in sequential combination with other, passive films of contrasting refractive index through some compatible deposition process, and offer a direct or indirect electrical mechanism of index change that can be effected within a simple and manufacturable physical structure. To be useful, the range of absolute index change must be on the order of a few per cent; it is known that within TFIC designs, the TFIF designs tend to be "resonant" in that they involve Fabry-Perot type single or multiple cavity structures which thereby leverage relatively small index changes in individual layers, on the order of 1% or so, into much larger percentage changes in the net optical characteristics (such as transmission of light) at a given wavelength.

Nevertheless, identifying thin film materials with appropriate characteristics has proven elusive and heretofore there has been no successful technology of tunable TFIC. Obtaining a sufficiently large index modulation in materials with good optical quality is a long standing difficulty in thin film science. The relatively small number of known, practical index control materials may be classified in two groups. High speed materials with small index modulations (on the order of $\Delta n/n = 10^{-5}$) include electro-optic, piezo-electric, or crystalline semiconductors using charge injection. Most of the attempts at tunable thin film filters to date have been based on such materials. Larger but slower index modulations ($\Delta n/n = 10^{-2}$) can be achieved with liquid crystals or thermo-optic effects. As recently as July, 2001, Parmentier, Lemarchand, et al, Towards Tunable Optical Filters, Paper WB1, Technical Digest, OSA Topical Mtg. Optical Interference Coatings, Jul. 15–20, 2001, Banff, Alberta, Canada, in a review of possible tunable-index materials for thin film interference coatings compared electro-optic films, piezoelectric films, and oxide thermo-optic films, found no suitable solution. These authors mention but specifically reject the possibility of thermo-optic effects, citing the dielectric films typically used in TFIC, such as tantalum pentoxide and silicon dioxide, whose thermo-optic coefficients are relatively small.

Tunable Filters

Tunable narrowband filters are a commercially important subset of the technology discussed above. Hence, there has been a great deal of research in the field of such filters. A typical requirement in communications is for a filter to tune over the so-called C band, 1528–1561 nm, with a −3dB width on the order of 10 GHz or 0.08 nm and a low insertion loss.

The growth of WDM fiber optic networks has increased demand for a variety of wavelength tunable optical components for diverse network management functions ranging from sources and receivers to dynamic gain equalizers, and dispersion compensators. Tunable optical filters are needed to play several distinct network roles, each with distinct performance requirements. For example, tunable add/drop filters, for which the filter is in the network path, must possess very low insertion loss and 'flat top' passband shape. For optical channel monitoring on the other hand, where the filter acts on light tapped off from the network, passband shape and insertion loss are less important than rapid tuning, low cost, compact device footprint and packaging compatible with integration into system modules such as optical amplifiers. These diverse requirements are not met by any one filter technology. Even two filters with identical optical and electrical characteristics may find very different applications if their physical size and shape and manufacturing costs are very different.

Many different approaches to tunable filters have been described, and as is often the case in optical technology, diverse operational principles have been put forward. Tunable filters with comparable passband or tuning range spanning a large range in physical size, form factor, power consumption, complexity and cost are known.

One major category of tunable filters comprise fiber or waveguide based devices. A second category, expanded beam or vertical cavity format tunable filters, are especially desirable and even necessary for certain purposes, in particular when the filter is intended to be integrated with other components in a module, or must be very compact. As indicated in Table I, the micro-electro-mechanical (MEMS) Fabry-Perot is the most widely developed technology in this category, with half a dozen commercial sources.

TABLE I

Expanded beam tunable filter technologies. Performance data from publicly available sources

| Mechanism | Linewidth, insertion loss | Tuning range | Limits | Sources |
| --- | --- | --- | --- | --- |
| MEMS | 0.4 nm 2.5 dB | 45 nm | No multi-cavity | Coretek, Axsun, Solus, others |
| Macro Interferometer | 0.2 nm 3 dB | 220 nm | Large footprint | Stocker-Yale (Optune) |
| Liquid crystal | 2.5 nm | 32 nm | Insertion loss? | Scientific Solns |
| Mechanical rotating thin film filter | 0.6 nm 2 dB | 35 nm | Passband shape | Chameleon Santec |

Less common approaches to expanded beam filters include liquid crystal devices and mechanically scanned gratings or interferometers. As a group, MEMS Fabry-Perot devices tend to possess wide tuning range, but have an important limitation; they are structurally restricted to the simplest type of single-cavity etalon (Lorentzian passband) design. This means it is impossible to fabricate MEMS filters with more sophisticated designs providing steep skirts for improved adjacent channel rejection, or specific group delay dispersion, or other requirements. Thus they are primarily useful for optical monitoring or tunable-laser applications, but less so for in-path network functions such as add/drop multiplexing, which requires more complex, flat-top, narrow skirt passbands only achievable with multiple cavity resonators.

In this survey it is striking that the most widely used static WDM filter technology, the thin film interference filter TFIF, has not had a practical tunable counterpart except for limited application of mechanically rotated filters. As noted, sophisticated fixed passband TFIF designs incorporating multiple cavities are well known in thin film technology, and the addition of tunability to the many design options of thin film coatings would be highly desirable.

Thermo-optic Use of Semiconductors

It is known that one method of altering the index of optical materials is by varying their temperature. The thermo-optic principle is of interest because, while present in all optical materials to some degree, relatively large effects, on the order of 1% or more, can sometimes be found in materials with very low optical loss in the optical communications bands 1300–1700 nm.

Table II compares the thermo-optic properties of some optoelectronic material families relevant to use in the near infra-red spectrum.

TABLE II

Thermo-optic materials

| | |
| --- | --- |
| Polymers | |
| Acrylates, polyimides (n~1.5) | $-4 \times 10^{-4}/K$ |
| Thin film dielectrics | |
| $SiO_2$ (n = 1.44) | $9.9 \times 10^{-6}/K$ |
| $Ta_2O_5$ (n = 2.05) | $9.5 \times 10^{-6}/K$ |
| Crystalline semiconductors | |
| c-GaAs | $2.5 \times 10^{-4}/K$ |
| c-Si (n = 3.48, Ghosh, after H. Li) | $1.8 \times 10^{-4}/K$ |
| c-Ge (n = 4.11, Ghosh, after H. Li) | $5.1 \times 10^{-4}/K$ |
| Thin film semiconductors | |
| $\alpha$-Si:H (n = 3.4, Della Corte, sputt.) | $2.3 \times 10^{-4}/K$ |
| $\alpha$-Si:H (n = 3.6, Aegis, PECVD) | $3.6 \times 10^{-4}/K$ |

Thermo-optic polymers including acrylates or polyimides have large (negative) thermo-optic coefficients but can typically only be applied in waveguide forms, as they are not suitable for the deposition processes used for multilayer TFIF. Crystalline semiconductor wafers possess relatively large coefficients, but of course cannot be considered thin films, which for the purpose of this writing means thicknesses of zero to 5 micrometers. With special etching or polishing techniques, wafers can be prepared as thin as 25–50 micrometers, but this process is expensive and difficult to control and handle. In general, crystalline materials grown as wafers are much more difficult to determine as to exact thicknesses than direct-deposited amorphous thin films or epitaxial crystalline thin films, and cannot easily be combined into complex multiple film stacks. Therefore, complex transverse filter structures, for example those with multiple cavity layers cannot be built. Cocorullo and others have demonstrated guided wave components using the thermo-optic properties of thin silicon crystal wafers:

Cocorullo et al, Amorphous Silicon-Based Guided Wave Passive and Active Devices for Silicon Integrated Optoelectronics, IEEE J. Selected Topics Q. E., v.4, p. 997, November/December 1998.

Cocorullo, Della Corte, Rendina, Rubino, Terzini, Thermo-Optic Modulation at 1.5 micron in an $\alpha$-SiC $\alpha$-Si $\alpha$-SiC Planar Guided Wave Structure, IEEE Phot. Tech. Ltrs. 8, p.900, 1996.

Cocorullo, Iodice, et al, Silicon Thermo-Optical Micromodulator with 700 kHZ -3 dB Bandwidth, IEEE Phot. Tech. Ltrs. 7, p.363, 1995

Della Corte, et al, Study of the thermo-optic effect in $\alpha$-Si:H and $\alpha$-SiC:H at 1,55 micron, Appl. Phys. Lett., 79, p.168, 2001

Cocorullo et al, Fast infrared light modulation in $\alpha$-Si:H micro-devices for fiber to the home, J. Non-Crys. Solids, 266, p.1247, 2000.

And other workers have described expanded beam filters based on silicon wafers:

Niemi, Uusimaa, et al., Tunable Silicon Etalon for Simultaneous Spectral Filtering and Wavelength Monitoring of WDM, IEEE Phot. Tech. Ltrs. 13, p. 58, 2001.

Iodice, Cocorullo et al., Simple and Low Cost Technique for Wavelength Division Multiplexing Channel Monitoring, Opt. Eng. 39, p. 1704, 2000

There are no reports of the systematic use of thin film semiconductors, whether amorphous or epitaxial, with use of their thermo-optic properties, as a basis for complex multilayer TFIC or TFIF. In fact, previous writings on TFIF teach away from this very practice because TFIF technologists have avoided temperature sensitive materials in order to create coatings independent of environmental sensitivities. Thus, in the past, the thin film coating industry in general and the WDM TFIF industry in particular has avoided semiconductor materials of any kind in filters primarily because their thermo-optic properties are large and hence coatings made from them would be subject to strong alteration by temperature.

SUMMARY OF THE INVENTION

According to various embodiments and aspects of the present invention, there is provided a dynamically tunable thin film interference coating including one or more layers with thermo-optically tunable refractive index. Tunable layers within thin film interference coatings enable a new family of thin film active devices for the filtering, control, modulation of light. Active thin film structures can be used directly or integrated into a variety of photonic subsystems to make tunable lasers, tunable add-drop filters for fiber optic telecommunications, tunable polarizers, tunable dispersion compensation filters, and many other devices.

BRIEF DESCRIPTION OF THE DRAWINGS

In the figures, in which like reference designations indicate like elements.

DETAILED DESCRIPTION

Figure 1:
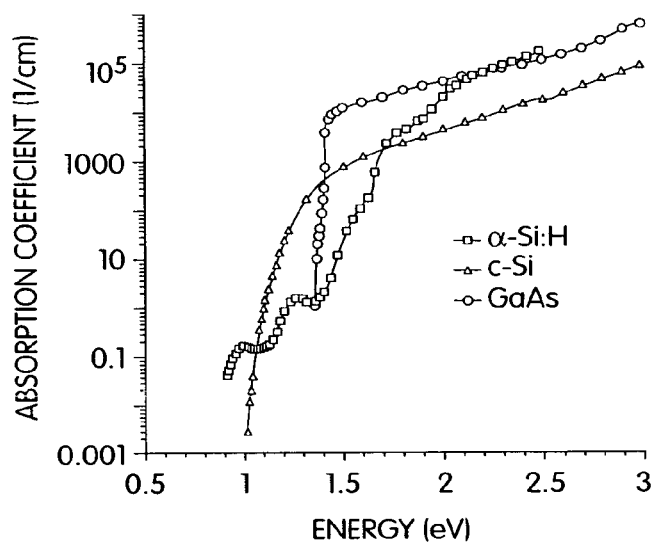
FIG. 1 is a graph of absorption for crystalline silicon and low-loss amorphous silicon measured by transmission, photothermal deflection spectroscopy (PDS) and by the constant photocurrent method (CPM) at a wavelength of 1500 nm corresponding to 0.8 eV.

The invention is now illustrated by the following description of several embodiments, aspects and applications thereof.

We have elected to maximize, rather than minimize, the thermo-optic properties of certain layers in TFIC by using semiconductor thin films among the layers. These may be deposited by PECVD or other varieties of CVD or PVD. The thermo-optic semiconductors such as α-Si:H or alloys, hydrogen infused for low optical loss, serve as high index layers (n=3.66 at 1500 nm) and, as deposited by methods we have optimized, are highly transparent (extinction coefficient $k=10^{-6}$) at primary optical communication wavelengths near 1500 nm. Index modulations on the order of $\Delta n/n$ up to 4% may then be caused by temperature changes over the range 25–45° C. These large temperature changes are preferably caused by optically transparent, electrically conductive heater films such as n-type polysilicon adjacent to or interspersed with the other optical layers. A typical application is a tunable thin film Fabry-Perot filter, formed on a substrate such as fused silica by depositing quarter wave optical thicknesses of α-Si:H alternating with a lower index layer such as α-SiNx, both made by varying the gas mixture in a PEVCD reactor. The central transmission peak of the resulting TFIF may then be thermo-optically tuned by passing a current through the heater film or films. Likewise, multi-cavity TFIF may be fabricated by extension of similar methods to more complex designs. In our experiments, both single cavity and dual cavity filters have been demonstrated, with tuning ranges up to 42 nm.

Amorphous silicon is a highly developed and reliable material from the flat-panel display and solar cell industries.

By bringing this material and associated PECVD thin film deposition to optical interference coatings, it is possible to take advantage of unusually large thermo-optic coefficients to modulate selected film indices by as much as 4%. To do so requires internal film temperatures in excess of 400C, only feasible if extremely robust film adhesion is achieved. An early application demonstrated here is a single-cavity tunable Fabry-Perot band pass filter with FWHM as small as 0.085 nm (10 GHz) and tunability exceeding 40 nm at 1500 nm. Such tunable filters are also extremely compact, manufacturable on a wafer scale, and capable of being packaged with many of the off-the-shelf components already available for conventional static WDM filters. Tunable filters are suitable for various WDM network applications including optical monitors, tunable lasers, tunable detectors and add/drop multiplexers. Moreover, this family of tunable thin film interference coatings are capable of more general designs inducing multi-cavity flat-top filters, tunable edge filters, dynamic gain equalizers and tunable dispersion compensators. Refractive index control is a fundamental building block of photonic devices. Widely tunable thermo-optic films, now shown to be feasible not only in waveguide devices but also in interference coatings, open a new family of compact, low cost devices and applications.

Embodiments of the invention include transverse optical transmissions devices. That is, embodiments include devices through which light at a desired wavelength passes, but which do not act as a waveguide. For example, a thin film of material on a substrate through which light is transmitted substantially normal to a surface of the substrate is a transverse optical transmission device. Embodiments of the invention are characterized by one or more thin-film layers having an index of refraction that varies with temperature and an internal, controllable heat source. Generally, thin-film layers are those whose thickness is less than about 5 µm, whereas the thinnest layers generally achievable using semiconductor wafer polishing technology presently available are on the order of 50 µm. In this application, thin-film layers are often described as directly deposited, although other methods of making thin films are possible.

Embodiments of the invention may be incorporated in or include tunable thin-film interference filters having multiple thin-film layers. One or more layers may have an index of refraction that varies responsive to an energy excitation source, such as heat or light at a control wavelength. Also, if the layer with a variable index of refraction responds to heat, one or more layers may be a source of heat to vary the index of refraction of the heat-variable layer. The heat-variable layer may itself be a resistively heated layers.

Several embodiments illustrating these general principles are now described in detail.

The embodiments now described use the thermo-optic properties of thin films of semiconductors, for example layers of amorphous silicon (here "α-Si" or "α-Si:H" to denote hydrogenation). These embodiments control the temperature of such films by exciting films that produce heat in response, which films are integral parts of the structure or stack, and may be the same films whose index is to be controlled, or may be other films in the stack specifically included as thin film heaters. The excitation may be a current passed through a film or may be a light beam directed on the film or may take another suitable form. Films integrated into the structure provide heat for tuning, and can also play an optical role along with their heating role, thus doing 'double duty.' This approach can be applied whenever the wavelength at which the structure is to be used is also a window of transparency for the thin film used. An important, but non-limiting, case is the fiber optics telecommunications wavelength window 1300–1650 nm, at which certain semiconductor films are highly transparent.

Semiconductors have large thermo-optic coefficients, about $4\times10^{-4}/°$ C. for Si and twice as large for Ge, either crystalline or amorphous. These are available in a variety of forms, crystalline, micro-crystalline, or amorphous, which may be grown as single crystals or by direct deposition or epitaxially. Direct deposition methods include physical vapor deposition techniques such as evaporation or sputtering, or chemical vapor deposition using gases.

Instead of avoiding their temperature sensitive properties for optical structures, as suggested by conventional practice, we have intentionally used semiconductor materials.

Figure 2:
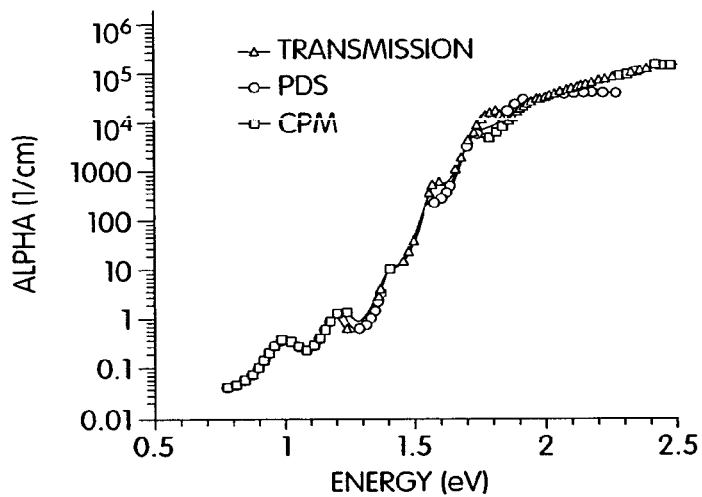
FIG. 2 is a graph of absorption for low loss α-Si:H, measured by PDS and CPM.

We make use primarily of the amorphous semiconductor family as a preferred embodiment in order to maximize thermo-optic tunability in thin film interference structures, although other types of thin film semiconductors, such as microcrystalline or epitaxial crystalline films are also possible. Amorphous semiconductors, which have been developed over many years primarily by the flat-panel display and solar cell industries, are undeveloped by the photonics and fiber optic device communities. They can be deposited as thin films by various physical vapor deposition techniques such as sputtering, or chemical vapor deposition techniques such as plasma-enhanced chemical vapor deposition (PECVD). PECVD is a particularly flexible and homogeneous thin film process, and control of the basic deposition parameters such as plasma power, total gas pressure, hydrogen partial pressure, gas ratios, flow rates, and substrate temperature can be used to significantly modify film density and stoichiometry which in turn influence index, optical absorptivitiy, and thermo-optic coefficients. Hydrogenation of the Si films decreases defect densities by quenching dangling bonds, reducing infrared absorptivity. FIG. 1 shows the absorptivity of crystalline vs. amorphous silicon as measured by the constant photocurrent method (CPM) and photothermal deflection spectroscopy (PDS), and FIG. 2 shows our low loss α-Si:H optimized for use in the WDM band at 1500 nm (corresponding to 0.8 eV). The 1500 nm value of absorptivity of $0.1$ cm$^{-1}$ corresponds to extinction $k=1\times10^{-6}$, comparable to low loss dielectric materials commonly used in conventional thin film WDM filters. In addition to PECVD, other CVD methods such as low temperature CVD or thermal CVD could be used, or the amorphous films could be deposited by sputtering.

Hydrogenated amorphous silicon (α-Si:H), despite its high index (3.6) and low absorptivity at 1500 nm, has not usually been considered as a desirable high index layer in thin film interference filters. There are two reasons. First, PECVD has only recently been introduced into optical thin film technology. Second, amorphous semiconductors have been avoided for conventional WDM filters precisely because of their temperature sensitivity. Thermo-optic coefficients of amorphous semiconductor thin films tend to be even higher than their crystalline counterparts. In our laboratory, by optimizing PECVD conditions, we have achieved α-Si:H films with the thermo-optic coefficient of $\Delta n/n=3.6\times 10^{-4}/°$ K and extinction coefficient $k=10^{-6}$ at 1500 nm, which appears to be larger than any other value reported in the literature. By applying internal film temperatures >400° C., silicon index modulations $\Delta n=0.14$ or $\Delta n/n=0.04$ have been observed. Except for liquid crystals, it is difficult to obtain such large index modulations in any other materials family.

Although thermo-optic mechanisms are considered slow, we discovered this not to be the case. Depending on the volume of the active device, index modulation times can be sufficiently fast for a broad range of applications. A simple physical estimate based on the specific heat, thermo-optic index and thermal conductivity of α-Si suggests that a 5 μm thick, 100 μm square thermal mass can undergo a 3% index modulation in as little as 10–50 μs. In an actual operational system, with limited power consumption, our devices are typically tuned over 40 nm in approximately 5 ms.

In order to achieve such large temperature excursions in thin film structures whose total thickness may be only a few micrometers, extremely robust film adhesion is a primary requirement. As a plasma based technique, PECVD offers the process variability to produce dense, compliant films of several optically distinct but process-compatible materials, such as amorphous silicon and amorphous silicon nitride or silicon dioxide, with widely different indices. Transition between materials is accomplished by controlling gas mixtures, without breaking vacuum. In the studies reported here, thin film structures based on amorphous silicon and silicon nitride have been demonstrated in our laboratory to undergo repeated temperature gradients exceeding 500° C. over 200 μm without delamination or failure. Martinu et al have shown the benefits of PECVD for the physical properties of dielectric thin films, including reduced stress [L. Martinu, "Plasma deposition of optical films and coatings: a review," J. Vac. Sci. Technol. A18(6), p.2629, 2000.].

Figure 3:
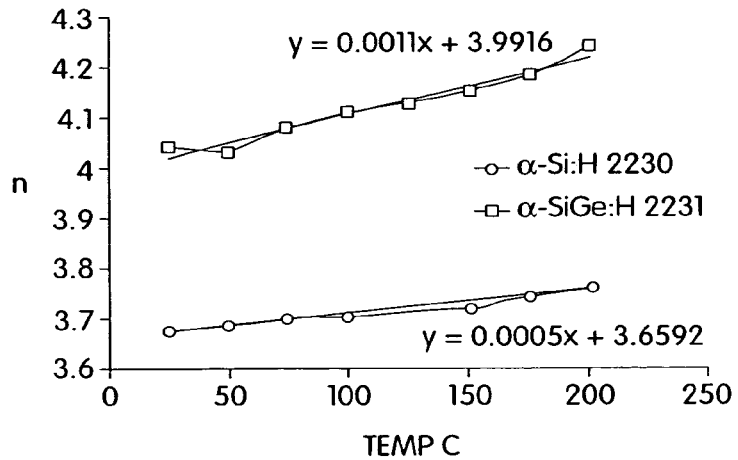
FIG. 3 is a graph of index of refraction v. temperature for amorphous silicon (lower trace) and for silicon-germanium alloy (upper trace)

In exploring this new device family, we have attempted to maximize thin film thermo-optic tunability, rather than to minimize it as has been the goal for conventional fixed filters. However, device design must take into account that thermo-optic coefficient in semiconductors is not a constant, varying by about 30% from room temperature to 700° C. Ghosh [Handbook of Thermo-Optic Coefficients of Optical Materials and Applications, G. Ghosh, Academic Press, New York, 1998] has shown that the thermo-optic effect in semiconductors is primarily due to the change in the exciton band edge with temperature; a single-oscillator model provides a good fit to the thermal index change both of crystalline and amorphous semiconductors. The change of index with temperature for both amorphous silicon and a silicon-germanium alloy is shown in FIG. 3. The larger dn/dT of SiGe is accompanied by larger absorptivities for 1500 nm systems making it less suitable. Processed as described herein, in our laboratory, α-Si has been seen to have an even larger dn/dt than previously reported.

Thus one or more layers of thin film semiconductor are deposited, intermixed in various permutations and combinations with layers of compatible, but not primarily thermo-optic films in order to implement complex designs. The keys to success are high optical quality films, closely controlled layer thicknesses, internal heating to high enough temperatures to achieve Δn/n up to 0.04, temperature modification over a small thermal mass only, and extremely strong film adhesion to withstand the resultant thermal stresses.

Direct deposition of films using techniques such as PECVD permits adjustment of the index of the layer by controlling the stoichiometry of the film. Mulitple layers can be deposited continuously, leading to improved device yields. Additionally, the duration of the deposition determines layer thickness. Layers thinner than 1 μm are possible. A challenge with these materials is to deposit optical quality layers with low optical absorption. This challenge is met as described below.

Films can also be deposited epitaxially. This can result in highly ordered material with low scattering loss and potentially low absorption. depending on the material used. Epitaxial growth, however, is a slow process.

Single or multiple layers of polycrystalline material can be fabricated by first depositing amorphous layers and then recrystallizing at high temperatures using processes such as high temperature anneal, rapid thermal anneal, or excimer laser recrystallization.

Amorphous materials offer some advantages over the other two types. For example, amorphous layers can be deposited much more quickly than epitaxial layers, with control over index through stoichiometry. Because films are amorphous, there would be little if any optical polarization dependence as compared to well-ordered crystal structures. Also, scattering from grain boundaries, which occurs for polycrystalline materials, does not occur in amorphous layers. Nevertheless, optical loss does occur for amorphous material, typically due to defect absorption.

In order to reduce optical absorption from defects located in the optical/mobility gap, a few techniques can be employed. The first is to hydrogenate the films during deposition in order to passivate dangling bonds. Another is to recrystallize the amorphous film layers through methods previously mentioned. While this can dramatically reduce the effect of defect absorption in the bulk, it replaces it with increased absorption from defects and scattering at the grain boundaries.

The foregoing disclosed embodiment of aspects of the invention possesses many advantages over conventional optical devices.

The new devices can be produced on the surface of a substrate using conventional semiconductor processing, as described above, resulting in the potential to produce many devices on each substrate, permitting on-substrate test capability and low-cost producing. Further advantages and variations on the foregoing are now discussed.

New devices made in accordance with the principles of aspects of the invention include a tunable versions of a widely-deployed passive device further having very low packaging costs. Thermo-optical tuning results in simple device design and a high degree of tunability. By using inorganic semiconductor materials, one obtains a high thermo-optic coefficient and a large temperature range of operation. There are many compatible deposition techniques available including direct deposition. Direct deposition is advantageous at least for producing thin films using automated continuous processing having high yield potential. It is also very flexible in terms of the ranges of refractive index and thickness that can be produced. Using amorphous semiconductor material results in smooth surfaces. Choices of materials are very flexible. Hydrogen can be added to treat dangling bonds in the materials, directly in a PECVD process. In an alternative process, amorphous materials can be recrystallized to polycrystalline form having lower absorption than the amorphous precursor and a smoother surface than directly-deposited polycrystalline material. Hydrogen annealing can reduce the effects of crystal interfaces.

As described above, by integrating one or more heating layers into the stack, a very fast response speed, low power consumption and relatively high temperature uniformity can be obtained. Resistive electrical heating allows for delivery of high power density, accurate control of power delivery and potentially allows heating layer to be used as a temperature monitor, as well.

As noted above, polycrystalline semiconductor layers can be deposited as amorphous layers and recrystallized on top of various substrates. They can be integrated at various points in the optical thin film stack and can be carefully tuned optically as well as electrically.

A method of controlling the temperature of the thermo-optic layers over a wide range, room temperature to approximately 500° C. must then be provided, since ability to use the thermo-optic properties of amorphous semiconductor materials depends on an efficient, rapid, well-controlled method of changing the film temperature. Local internal heating—that is, within the stack of thin films itself and not its entire environment, as must be done in the case of polymers—is strongly preferred for efficiency and speed, although other methods such as proximity to a heater may also be used. The preferred method is to include in the stack of thin films, or between the substrate and the TFIC, or above the last layer of the TFIC, a heater film which is integrated into the optical design (that is, has a specified thickness and index) but is both optically substantially transparent and electrically conductive at the wavelength of use, which unless otherwise specified will be assumed to be in the 1300–1800 nm range. We have found that n-type polysilicon, formed first by amorphous deposition and then recrytallized by heating in a furnace, is an excellent choice, although other films such as conductive ZnO or related materials may also be used.

Other possible methods of heating the film include non-electrical ones such as direct absorption of light at a wavelength where it is strongly absorbed, which in the case of α-Si:H may be 500–950 nm. This can lead to an optically controlled tunable optical filter provided that illumination of substantial optical power, such as a few mW is provided, which could be delivered by multimode optical fiber. Or, since as disclosed in previous Aegis patent filings it is possible to form thin film PIN sensors, passage of an electrical current in an intrinsic, P- or N-doped film can be modulated by a relatively low intensity incident light source. Alternatively, an external heat source, such as control of the substrate temperature, or use of a resistive heater strip adjacent to the filter can also be used without any direct electrical or optical connections to the semiconductor spacer film. This combination of optical effects, photoconductive effects, electronic effects and thermal effects within our class of preferred materials affords several modalities of heating the films, but our primary results have been obtained with conductive films integrated into the TFIC.

These methods can be used to make a wide variety of TFIC whose optical characteristics can then be controlled electrically by heating to alter the index of the thermo-optic layers. Since some of the films change in index as a function of temperature, the optical behavior characteristics of the TFIC as a whole will also depend on temperature, more or less strongly depending on the design and its specific sensitivity to individual film indices. This means that a TFIC incorporating various thermo-optic and non-thermo-optic layers will display various optical sates of transmission, reflection, or phase shift over a given spectral interval, as a function of temperature.

Within this general invention is a subset of TFIC whose dependence on index of certain films is particularly strong, namely those containing resonant cavities. The generic structure of an optically resonant cavity within the thin film stack is a cavity (whose optical thickness is a multiple of half-wave optical thicknesses) sandwiched between mirrors (formed by alternating quarter waves of high and low index materials). There the quarter and half waves are defined in terms of the resonant wavelength. The simplest and most important example of such a TFIC is the fabrication of a tunable thin film optical filter TFIF, which incorporates a single cavity and two mirror structures. Due to the resonant effect, a small thermo-optic change in the index of the cavity layer alone, on the order of 4%, may result in an effective change in transmission near the resonant wavelength of nearly 100%.

Figure 4:
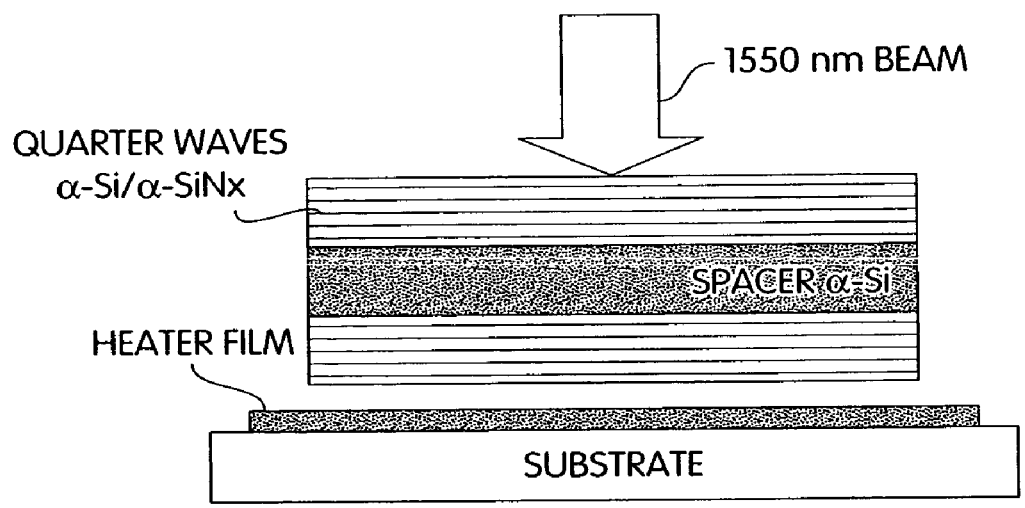
FIG. 4 is a schematic drawing of a basic thin film tunable filter including a heater film of ZnO or polysilicon, mirrors of alternating quarter waves of amorphous silicon and silicon nitride, and a spacer of an integral number of half waves of amorphous silicon.
Figure 5:
FIG. 5 is a SEM of an experimental embodiment of a Fabry-Perot filter deposited by PECVD and viewed at angle, in which light layers are amorphous Si, dark layers are SiNx, and a line points to a spacer film, 431 nm thick.

FIG. 4 shows a basic device structure for a thermo-optically tunable single cavity Fabry-Perot thin film filter. A heater film, which is electrically conductive, optically transparent at 1500 nm, capable of precise thickness control and strong adhesion over a wide temperature range, is integrated into the optical interference design. The filter stack proper is then made of only two materials, α-Si:H (n=3.67) and non-stoichiometric SiNx (n=1.77), as measured by spectroscopic ellipsometry, for the mirror layers and cavity. As is well known, thin film mirrors are designed as alternating quarter wave pairs of high and low index films, and the cavity consists of an integral number of half-waves, typically two to four. Because of the large index contrast between α-Si and SiNx, a relatively small number of mirror pairs is required. Even 4 pairs yields reflectivity R=98.5% at the design wavelength, and 5 pairs yields R=99.6%. In comparison, using conventional dielectrics such as tantalum pentoxide (n=2.05) and silicon dioxide (n=1.44), 10 quarter wave film pairs are required to achieve R=99.5%. FIG. 5 shows a scanning electron micrograph of the actual film stack as deposited.

Figure 6:
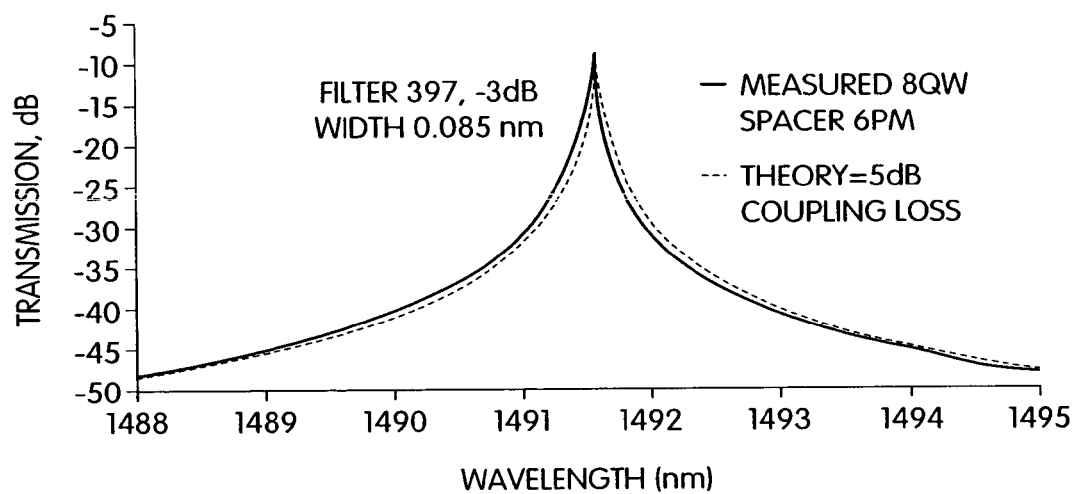
FIG. 6 is a graph of a filter transfer curve, comparing theory and experiment for single-cavity, high-fineness filter.

FIG. 6 shows a single cavity filter thermal measurement which illustrates the finesses achievable with these materials. Using 6 mirror cycles and a fourth order spacer (4 half waves), the −3dB width was 0.085 nm for a free spectral range of 388 nm and a finesse approximately F=4,500. The formula for this coating is:

Substrate |HLHLHLHLHLHL 8H
   LHLHLHLHLHLH| air

In this notation, the letters H and L stand for quarter wave optical thicknesses of films. H, the high index layer, is α-Si:H (here H means hydrogen) and L, the low index layer is α-SiNx. The cavity 8H, is eight quarter waves or index x thickness=2 full waves where a full wave is approximately 1550 nm.

Figure 7:
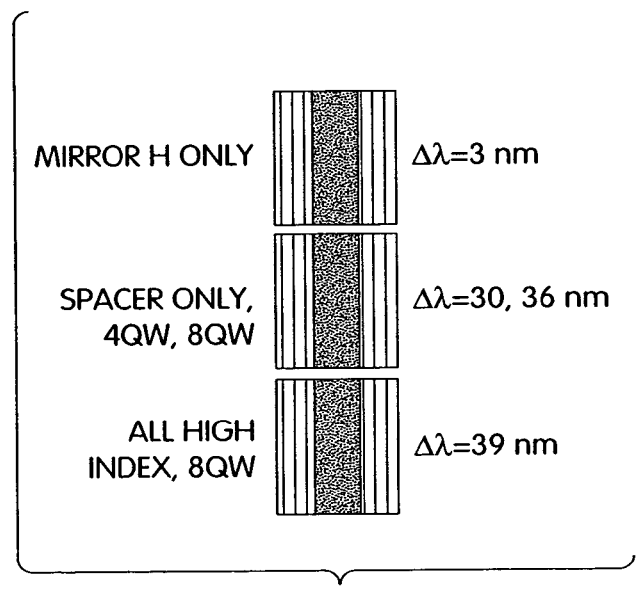
FIG. 7 is a schematic representation of the differences in tunability using different thermo-optic layers in a filter structure.

Thermo-optic tunability range depends on which layers in the filter are thermo-optically active. The resonance condition in a Fabry-Perot is $nt - \phi \lambda / 2\pi = \frac{1}{2} m\lambda$ where n=spacer index, t=cavity thickness, m=order, φ=phase shift reflection at mirrors, and λ=resonant wavelength. This implies that the filter can be tuned to some degree by allowing the high index layers in the mirrors to be thermo-optic. FIG. 7 shows the predicted effect of making the mirror high index layers, spacer only, or all high index layers thermo-optic.

Figure 8:
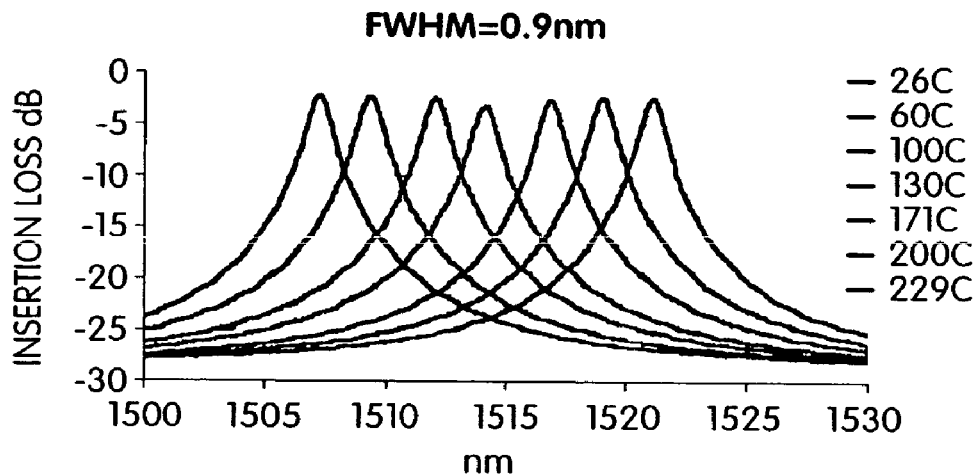
FIG. 8 is a graph of filter transfer curves moved through a tuning range by heating.

FIG. 8 shows the thermal tuning of a filter with amorphous silicon spacer and dielectric mirrors (tantalum pentoxide high index and silicon dioxide low index layers, deposited by ion-assisted sputtering, R=98.5% mirror reflectivity), heated in an oven from 25° C. to 229° C. The tuning was approximately 15 nm or $d\lambda/dT = 0.08$ nm/K.

Figure 9:
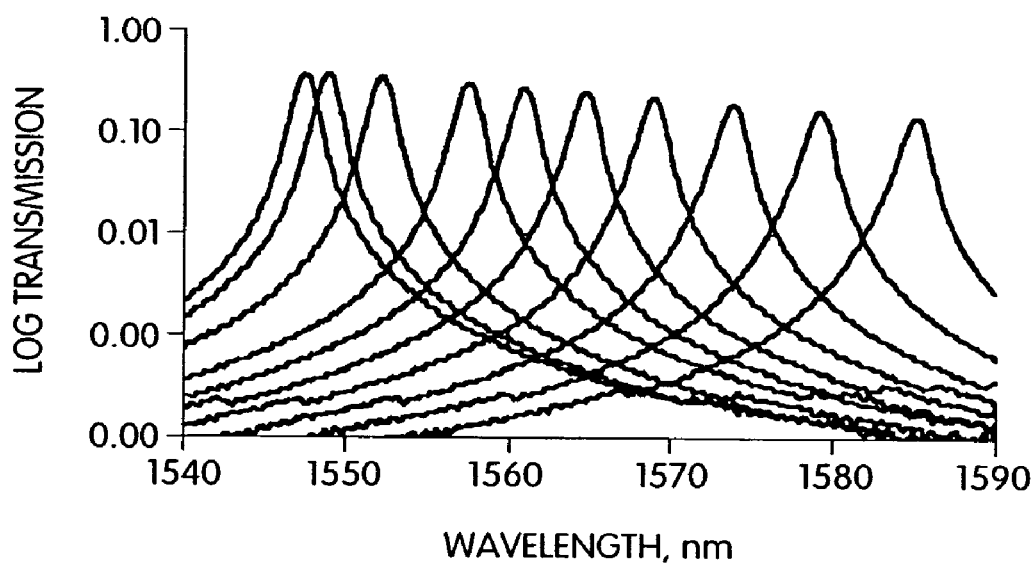
FIG. 9 is a graph of filter transfer curves for another filter, moved through a tuning range by heating.

FIG. 9 shows the thermo-optic tunability of a filter made with all-PECVD films using amorphous silicon not only for the spacer but also for the mirror high index layers. This filter, with 4 period mirrors, also incorporates an electrically conductive ZnO layer for heating internal to the film stack. Internal heating is able to achieve much higher local film temperatures; tuning range in this example was 37 nm. Although the temperature in the film is difficult to measure precisely, the current in the ZnO film was 0–100 mA, corresponding to temperatures estimated to exceed 400° C.

We have observed tuning coefficients 0.08–0.15 nm/° K by use of various spacer alloys and filter designs, and overall tuning ranges exceeding 40 nm. By comparison, conventional static thin film filter technology aims to achieve thermal variation of center wavelength <0.0005 nm/° K for narrowband WDM filters, accomplished in part through use of high CTE substrates to compensate small amounts of thermo-optic tuning. Thus the use of amorphous semiconductor films, optimized PECVD deposition, thermally optimized substrates, and internal heater films to maximize thermal control, results in thermo-optic tunability approximately 300× larger than typical fixed WDM filters. This approach offers, for the first time to our knowledge, thin film Fabry-Perot filters tunable over the entire WDM C band 1528–1561 nm without moving parts.

Figure 10:
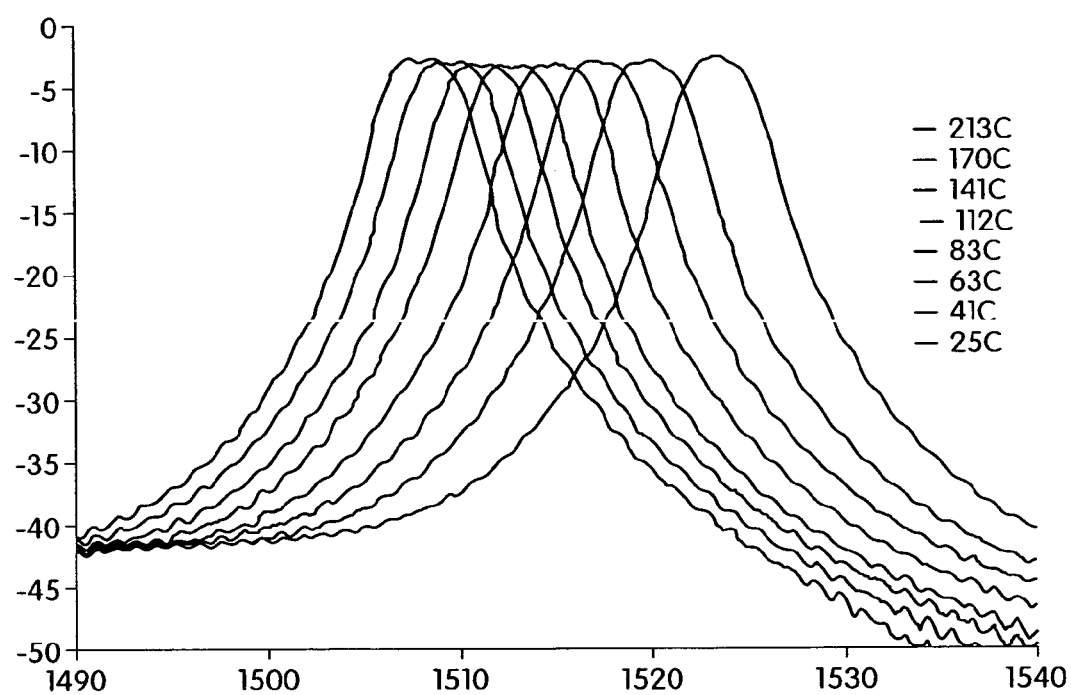
FIG. 10 is a graph of filter transfer curves for yet another filter, moved through a tuning range by heating.

A summary of the results obtained to date by us is as follows:

Ranges of characteristics achieved in single-cavity thermo-optic filters may be summarized as follows:
FWHM range from 0.085 nm to 2 nm
Finesse ranges from 1500 to 4500
Tunable band >40 nm
Insertion loss ranges 0.2–4 dB depending on design
Tuning speed 5 ms over full range These appear to be the best results ever obtained for a tunable single cavity TFIF. However, thermo-optically tunable TFIF by the methods described also permit multi-cavity designs, greatly expanding the range of possible performance characteristics. We have demonstrated a relatively simple two-cavity design according to the formula Substrate |HLHLHL 4H LHLHLH L HLHLHL 4H LHLHLH| air Here the two cavities are 4H each and the central L layer is a coupling layer between the dual Fabry-Perot structures. The results of thermally tuning this filter is shown in FIG. 10, which shows the flat-top characteristic and approximately 15 nm of tuning over the temperature range 25–213° C. To our knowledge, this is the first widely tunable, multi-cavity, TFIF ever demonstrated. It is now obvious that many even more elaborate structures are feasible, including, a variety of non-bandpass designs such as dynamical gain equalizers, tunable dispersion compensators, and others.

Figure 11:
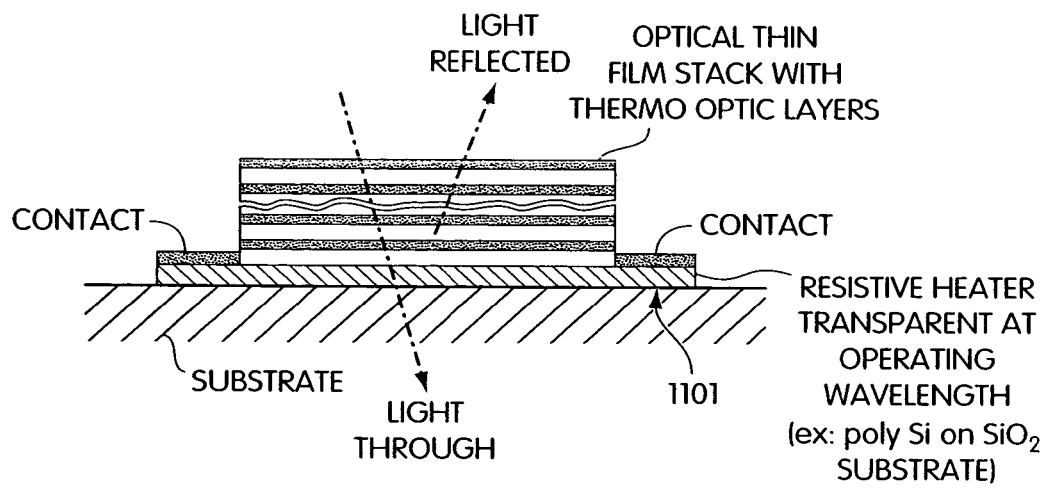
FIG. 11 is a side view of another embodiment of the invention.
Figure 12:
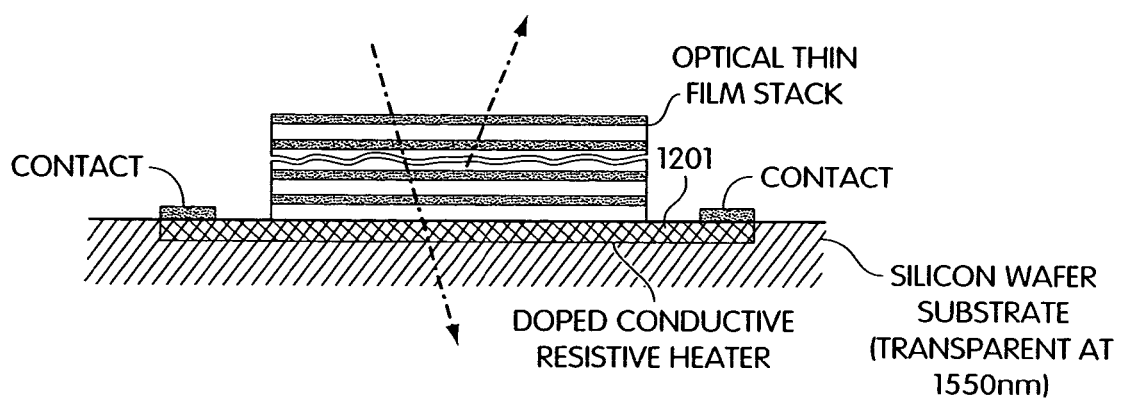
FIG. 12 is a side view of yet another embodiment of the invention.

An example of a suitable heater film is N-doped polysilicon, shown in FIG. 11, 201 which has a small optical absorptivity at the optical communications wavelength around 1500 nm. Alternatively, an integral heating layer FIG. 12, 301 may be formed in the substrate; for example, a heating layer may be defined by selective doping of a crystalline silicon substrate. Either the tunable layer 403 or layers or the heater layer 404 or layers may be at any position in the stack, adjacent to the substrate, etc. TFICs with up to 200 or more layers are known in the art, though they are not thermo-optically tunable. Conventionally in the art, they are designed for very low wavelength variation, less than 0.01 nm, in center wavelength of the passband over an expected temperature operating range.

Some alternatives for control of the filter center frequency by temperature are now described. Control can be achieved in a number of ways including, but not limited to, the following:

The entire substrate on which the optical layers sit can be heated up. This approach works for applications where temperature adjustments do not need to be fast. However, the relatively large thermal mass of the substrate limits the rate of temperature changes, including both heating and cooling. This is undesirable in applications where rapid tuning, i.e. rapid temperature change is required. In such applications, a more precise and efficient heating strategy is needed.

For example, a separate heating element located very close to, but not in the optical path can be used. The heating element could be a resistive ring surrounding the optical path, for example. Such an embodiment is described below. Heat can then be delivered through the substrate or other contiguous layers to a thermo-optic layer (TOL).

Alternatively, the heating element is a layer in the optical stack itself and placed in the optical path. This allows intimate contact between the heating layer and the TOL, thereby providing an extremely efficient mode of heating. Heat is supplied where it is needed extremely quickly. Using this structure, temperature swings of hundreds of degrees Celsius in less than 100 msec are achieved.

Several methods of generating the heat can be employed. These include, but are not limited to, optical heating, lateral joule heating, i.e. applying heat from the side of the structure, and z-axis joule heating, i.e. applying heat along the transmission or z-axis of the structure. In optical heating, an optical source such as a laser operated at a frequency other than one of the signaling frequencies at which the device is used can be directed on or near the TOL. Absorption of this optical power by the TOL or one or more adjacent layers results in the generation of heat, and thus an increase in temperature of the TOL and the immediate area.

Joule heating methods are extremely attractive because of the ease of implementation. For example, an electrical current (I) can be run vertically or laterally through a sheet of resistive (R) material. Power (P), in the form of heat, is dissipated by the resistive element ($P=I^2R$) into connected areas. For example, the tunable optical layers can be placed immediately above this heater layer, resulting in potentially rapid temperature changes. Devices we have made using lateral currents have shown several hundred degrees Celsius change in as little as 10 msec using this approach.

The resistive material can be metal, intrinsic or doped semiconductor, or conductive oxide, for example. The material should have sufficient conductivity to deliver the desired power. For integrated heaters which sit in the light path, the heater material must also have the proper optical characteristics, i.e. index, thickness, absorption, etc. Also, the heater layer must withstand the high temperatures it generates without peeling or fracturing.

The substrate material for these thermo-optic devices should be chosen to process both thermal and optical characteristics desired. Suitable materials include, but are not limited to, silicon wafer, fused silica and sapphire. The heat generated and delivered into the tunable optical layer is also typically delivered into other volumes, particularly the substrate. It is possible for the substrate therefore to act like a heat sink. For example, if the substrate has high thermal conductivity, then more heat must be generated to raise the temperature of the TOL than if the substrate had lower thermal conductivity. Because the substrate affects the heat loss from the heated layers, it will also affect the thermal profile across the thermo-optic layer. This in turn may impact the optical performance of the device, e.g. the bandwidth of a tunable thin film filter. A good thermal insulator, e.g. fused silica, could be used if maximum delivery of heat to the TOL is desired. If rapid temperature changes are required, then a substrate with higher thermal conductivity, e.g. silicon wafer, may be desirable.

The design of such a tunable coating depends on the intended purpose. In the design computations, for example using industry standard thin film design software such as Thin Film Calc, produced by Software Spectra, Inc., designs are created using various values for the index of the one or more index-tunable films. In operation, the device is tuned or scanned between these design states by passing current through one or more of the heater layers.

Methods of deposition of the film stack may differ according to the materials used and the properties desired, as known in the art. Suitable methods include, but are not limited to plasma vapor deposition (PVD) methods such as electron beam deposition or ion assisted sputtering, chemical vapor deposition (CVD) methods such as thermal CVD or plasma assisted CVD (PACVD), low temperature CVD (LTCVD) and other techniques known in the art. Methods of making devices, including several additional alternatives are discussed further, below, after summarizing one design here.

Using plasma enhanced chemical vapor deposition (PCVD) deposition and films of $\alpha$-Si:H, poly-Si and SiN, our devices have been observed in our laboratory to survive large temperature excursions without failure, as much as 400° C. change from room temperature. This observed result, that devices survived such large thermal shocks functionally intact was a surprise, and is not entirely understood, but indicates very high adhesions between layers and relatively low thermally induced stresses. These very large temperature changes, concentrated in small volumes of thin films, combined with the large dn/dT as quoted above for $\alpha$-Si, means that the fractional index modulation of thin films can be substantial, up to $\Delta n/n=0.04$ for $\alpha$-Si. This magnitude of index change is primarily useful in resonant structures, such as Fabry-Perot designs, where it can result in a drastic modification of the spectral properties of the film. Even in non-resonant design however, significant changes in filter properties can be obtained. One result of this discovery is that very fast tuning speeds can be achieved because of the small thermal mass of the thin film structure and because of the large temperature ranges involved; furthermore, this can be achieved without external cooling, and temperature can be controlled with relatively high uniformity over the device by using an integrated heater layer.

The foregoing disclosed embodiment of aspects of the invention possesses many advantages over conventional optical devices.

The new devices can be produced on the surface of a substrate using conventional semiconductor processing, as described above, resulting in the potential to produce many devices on each substrate, permitting on-substrate test capability and low-cost producing. Further advantages and variations on the foregoing are now discussed.

New devices made in accordance with the principles of aspects of the invention include a tunable versions of a widely-deployed passive device further having very low packaging costs. Thermo-optical tuning results in simple device design and a high degree of tunability. By using inorganic semiconductor materials, one obtains a high thermo-optic coefficient and a large temperature range of operation. There are many compatible deposition techniques available including direct deposition. Direct deposition is advantageous at least for producing thin films using automated continuous processing having high yield potential. It is also very flexible in terms of the ranges of refractive index and thickness that can be produced. Using amorphous semiconductor material results in smooth surfaces. Choices of materials are very flexible. Hydrogen can be added to treat dangling bonds in the materials, directly in a PECVD process. In an alternative process, amorphous materials can be recrystallized to polycrystalline form having lower absorption than the amorphous precursor and a smoother surface than directly-deposited polycrystalline material. Hydrogen annealing can reduce the effects of crystal interfaces.

As described above, by integrating one or more heating layers into the stack, a very fast response speed, low power consumption and relatively high temperature uniformity can be obtained. Resistive electrical heating allows for delivery of high power density, accurate control of power delivery and potentially allows heating layer to be used as a temperature monitor, as well.

As noted above, polycrystalline semiconductor layers can be deposited as amorphous layers and recrystallized on top of various substrates. They can be integrated at various points in the optical thin film stack and can be carefully tuned optically as well as electrically.

Finally, a substrate of fused silica or quartz has a relatively low optical loss, can stand high temperatures used for recrystallization of optical or heated layers and has a low thermal conductivity, which reduces power consumption of devices.

Tunable TFICs, embodying aspects of the invention as described above may be incorporated in products, systems and applications which are now described. The TFIC element of each product, system or application described below can be tuned by thermo-optically varying the index of one or more internal films as described herein, above. First, some representative devices include:

Tunable narrow band filters with single cavity Fabry-Perot designs and the spacer a tunable film. The center wavelength of a narrowband filter is tuned in wavelength.

Tunable narrow band filters with multiple cavity Fabry-Perot designs and some or all of the spacers tunable films. Tunable filters with spectral shapes suitable for certain dense WDM functionalities.

Tunable add/drop filters. An "add/drop filter" is a narrowband filter for optical fiber telecom packaged so as to add or drop one individual WDM channel while allowing others to pass undisturbed. Tunable add/drop means that the wavelength of adding or dropping is tunable.

Tunable polarizer filters. Polarizing filters are TFIC, usually placed at an angle to the incident light, which transmit/reflect light preferentially according to wavelength. Tuning same means either to tune in wavelength of maximum polarization, or else to tune the birefringence at a fixed wavelength.

Tunable lasers (by integrating with VCSELS or edge-emitting lasers, or external cavity lasers). By this means it is possible to tune lasers in wavelength with no moving parts. In the case of VCSELs, tunable filters can be integrated on a wafer scale.

Dynamic gain equalizers. Dynamic gain equalizers are used in fiber optic telecom networks to balance the gain or optical power at different wavelengths in the WDM spectrum, by independently adjusting the spectral attenuation across the band (such as the C band). Tunability means that the various bins of attenuation can be independently varied by one or more thermo-optic tunable filters, typically in series.

Tunable chromatic dispersion compensators. Chromatic dispersion is a problem in emerging fiber networks, especially at data rates of 40 Gb/s in that pulses broaden over long path lengths. Compensators are introduced to balance these effects with dispersion of the opposite sign. Tunable compensators are TFIC (such as TF all-pass filters) whose dispersion slope is tunable, to adjust for changeable network conditions.

Tunable polarization dispersion compensators. Polarization dispersion refers to changing fiber environmental conditions that cause birefringence to vary in the fiber and thereby induces pulse broadening. A tunable TFIC compensator is designed to adjust the amount of compensation.

Variable attenuators. Tunable TFICs may be constructed to provide variable attenuation (either in transmissive or reflective modes) of specific wavelength ranges. Such a device is generally useful in optical communications networks and other applications.

A number of such structures including one or more of the features described above are further elaborated.

Tunable Bandpass Filter

Figure 13:
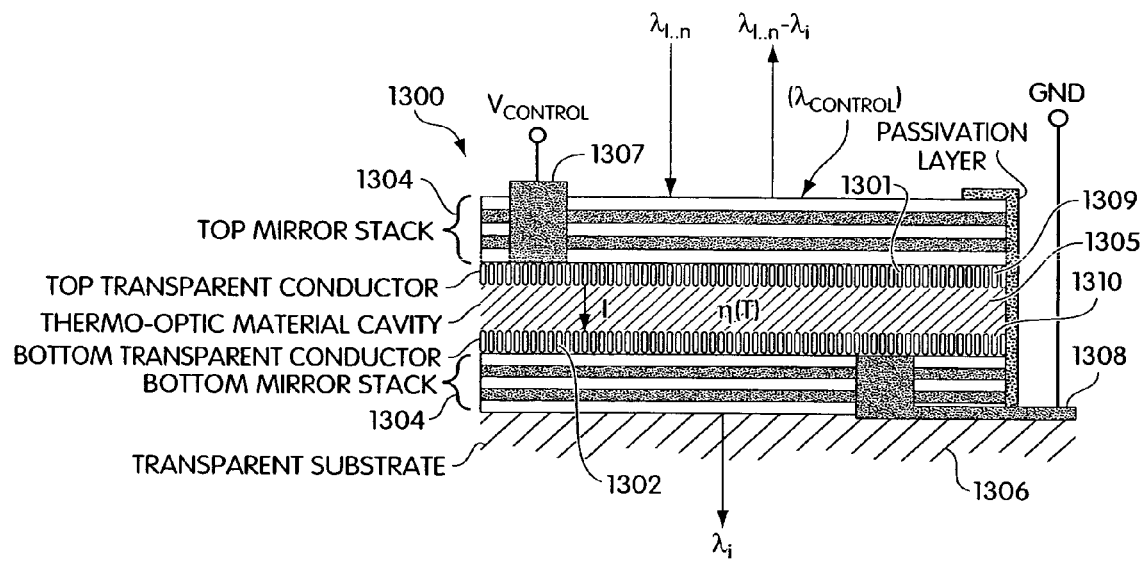
FIG. 13 is a side view of yet another embodiment of the invention.
Figure 14:
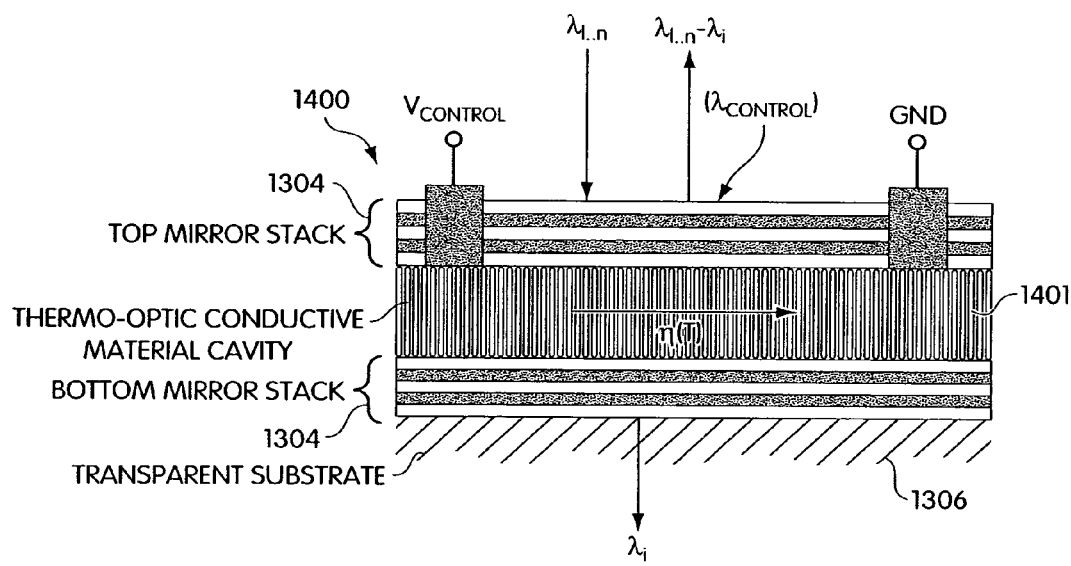
FIG. 14 is a side view of yet another embodiment of the invention.

FIG. 13 shows schematically the construction of a filter 1300 with the patterning of transparent conducting electrode films 1301, 1302, top and bottom mirror stacks 1304 and a thermo-optic cavity material 1305 that is self-heating on a Si wafer 1306. A current, I, through terminals 1307, 1308, transparent conductive layers 1309, 1310, and cavity layer 1305 cause resistive heating of layer 1305, and thus tuning of the index of refraction of layer 1305. The choice of numbers of high and low index layers in each mirror stack 1304, and other design parameters are chosen according to any suitable design method, but taking the design tuning range into account. FIG. 14 shows a structure 1400 in which transparent conducting electrodes are not used, and the current, I, is conducted in the plane of the film 1401. In this embodiment, the mirror stacks 1304 may be constructed to have any suitable thin film structure, including those known in the art. The index of the cavity material 1401 is tuned by heat. An alternative source of tuning energy discussed below is a control wavelength of optical energy.

Figure 15:
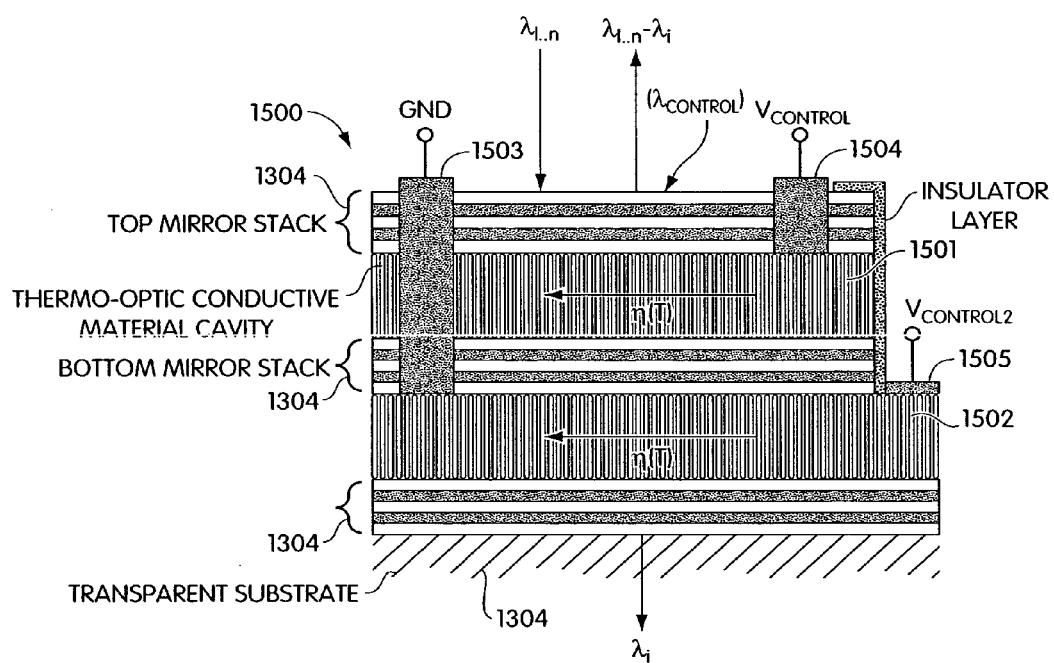
FIG. 15 is a side view of yet another embodiment of the invention employing plural cavities.

It is known in the art that use of multiple cavity Fabry-Perot designs, in which more than one cavity is incorporated in the film stack, can yield optical bandpass characteristics with flatter tops and steeper sides than the Lorentzian shape of a single cavity. FIG. 15 shows a film stack 1500 including multiple spacers 1501, 1502 and electrical contact 1503, 1504, 1505 to each of them. This design conducts tuning current, I, in the plane of tunable spacers 1501, 1502, to cause resistive self-heating.

Maximum temperature changes of as much as 400° C. about an ambient operating point are achieved and provide suitable index variation, with appropriate attention to the thermal conductivity of all the layers and substrate and the avoidance of delamination or distortion. In general, a high thermal conductivity substrate such as Si or sapphire is desirable to provide a heat sink; thermal engineering of the device and package are important for stable operation. Operation of the entire structure at an elevated ambient temperature (for example, 80° C.) through external control may also be advantageous, in order to eliminate the need to cool the structure near room temperature.

Instead of resistive heating, or in addition thereto, a control light used to tune the filter may be delivered directly by a laser beam, or through an optical fiber, or by locally placed LEDs mounted to illuminate the film.

Figure 16:
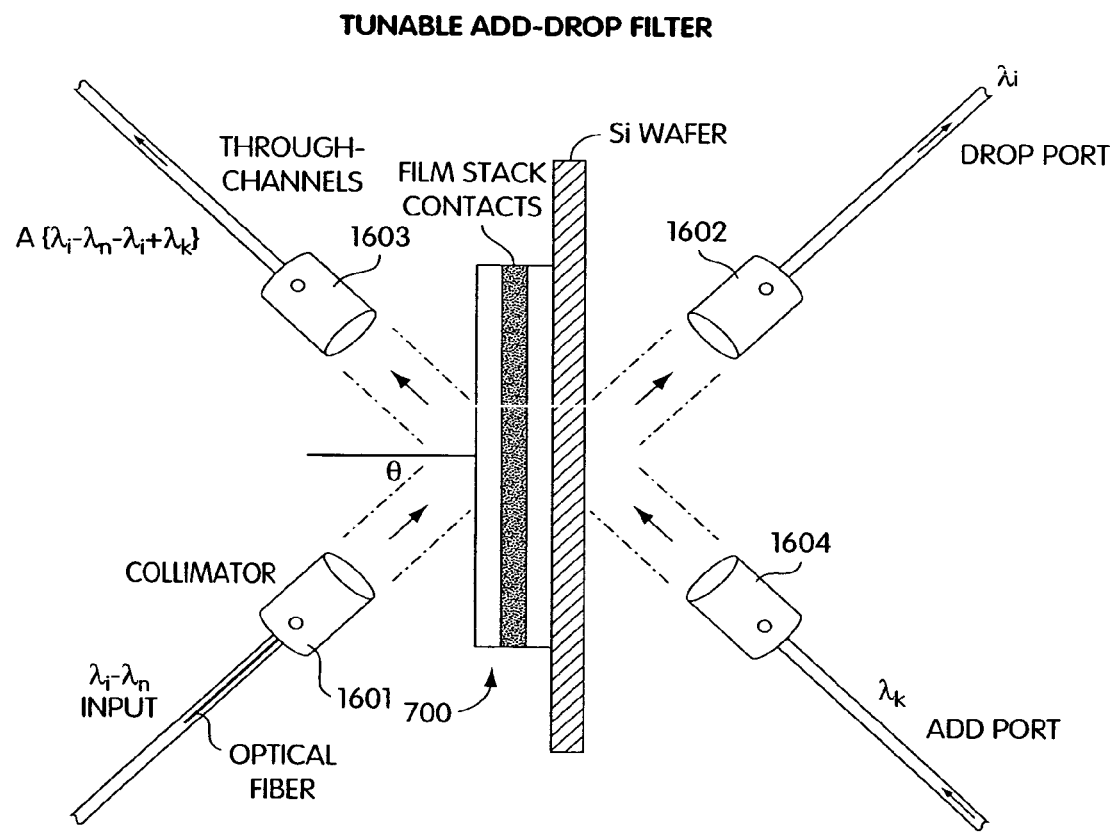
FIG. 16 is a side view of yet another embodiment of the invention configured as an add/drop filter.

FIG. 16 shows schematically the use of a slightly modified filter 1600 in one application, a tunable add/drop multiplexer for WDM optical networks. The filter 1600 is designed for use at a non-zero angle of incidence θ, for example 5–10°, by reducing all the film physical thicknesses by a factor cos (θ) in order to keep the optical thicknesses as specified earlier. The angle must be small enough so that no substantial polarization dependence is introduced, nominally <0.2 dB spec. The transmitted wavelength brought in on input port 1601 is dropped, and passes out drop port 1602. The remaining wavelengths are reflected to the through port 1603. If desired, an add wavelength may also be enabled by adding a fourth port 1604, as shown. It is an advantage of the present invention that conventional packaging and construction methods for existing thick film add/drop filter designs may be used with minor modifications, other than substitution of the tunable element for the usual fixed, static filter.

Linear or rectangular arrays of add/drop filter as described above may be fabricated on a wafer scale and assembled as a unit, providing for example 16×16 θ 256 independent tunable drop ports in a single integrated device.

Variable Optical Attenuator (VOA)

Figure 17:
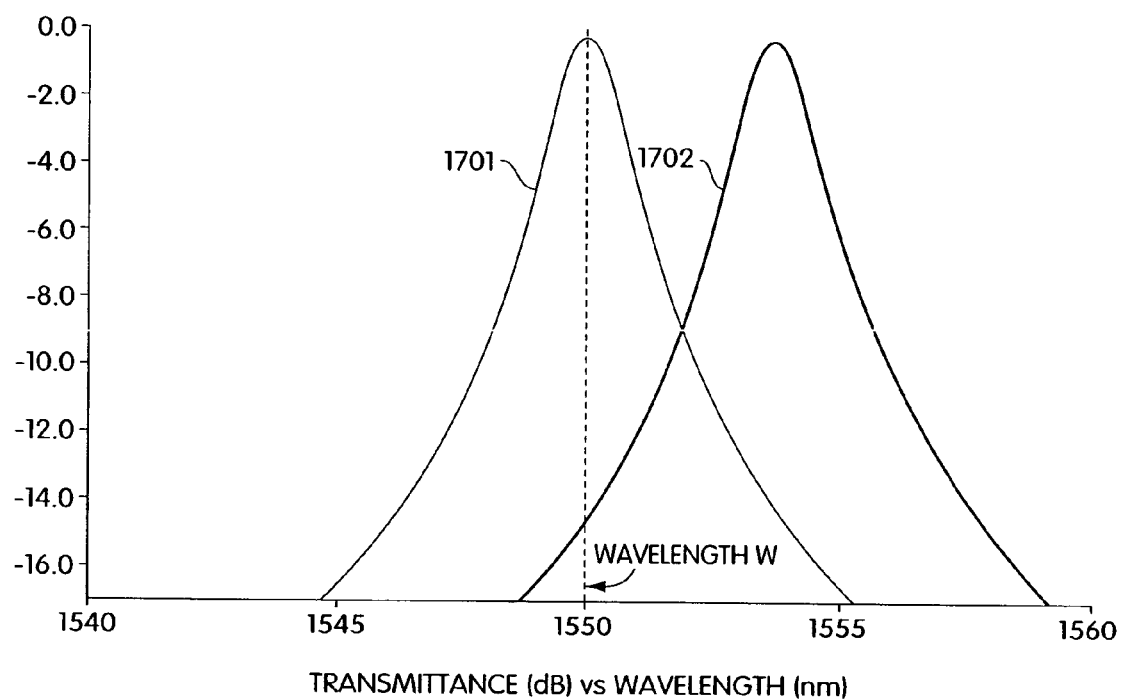
FIG. 17 is a graph illustrating a variable optical attenuator filter response.

Given a laser signal at a fixed wavelength λ, it is possible to design a filter characteristic such as that shown in FIG. 17 whose transmission at the wavelength λ may be varied over 17 dB of dynamic range, by tuning the filter. At one temperature, the filter operates with one transfer characteristic 1701, while at a second temperature, it operates with a second transfer characteristic 1702. This constitutes a VOA at the wavelength of interest, e.g. at 1550 nm. For the VOA application, a narrow bandwidth filter design may be moderated to provide a quasi-linear response. The design to produce the variable characteristic of FIG. 17 is as follows:

$$(HL)\hat{\ }4\ H\ (HL)\hat{\ }4\ H$$

where H is a high-index layer of α-Si and L is a low-index layer of SiN. This type of VOA applies a variable attenuation to any given channel in a band of approximate 30 nm, but not evenly to all channels at once.

Tunable Detector, Spectrometer or Channel Monitor

A photoconductor or PIN photodiode used as the spacer layer and controlled through current and illumination as a source of thermo-optic index modulation, nevertheless retains its function as a detector.

The light sensitivity would be strongly enhanced at the resonant wavelength, since that wavelength produces large electric field intensities in the PIN film whereas other wavelengths do not. Thus it is possible to design versions of the device which behave as wavelength tunable photodetectors, i.e., spectrometers, in which all the key functionality resides within a few μm of thin films. One important application for such a device would be to monitor the channel optical power levels in the various wavelength channels of a WDM optical fiber network by scanning through, for example the C band 1535–1565 nm with a narrow band filter.

A reverse biased PIN detector will be used to maximize the light sensitivity. The preferred embodiment for a spectrometer will use external heating to tune the filter, in order to separate the photocurrent associated with detection and the thermo-optic control mechanism. It is assumed that the photocurrent due to detection is small enough not to significantly cause thermal tuning by itself.

Alternatively, internal current temperature control may be used provided that design and operation of such a tunable detector is able to discriminate between the relatively small photocurrent response caused by the presence of the signal light at, for example, 1525–1565 nm, and the relatively larger current or photocurrent otherwise used to tune the filter thermo-optically. One way to discriminate is to modulate the signal light as a 'carrier' frequency, which is within the electronic bandwidth of the sensor, but higher than any frequency of variation of the current or photocurrent used for thermo-optic tuning. By amplifying the photocurrent signal at the modulation frequency 'lock-in amplification' it is possible to separate a small high frequency photocurrent from a larger low frequency current or photocurrent.

Tunable VCSEL or Other Laser

A tunable filter element as described can be used with various types of laser to make an integrated wavelength-tunable laser.

VCSEL laser arrays are fabricated on a wafer with a Fabry-Perot structure, a mirror stack made by molecular beam epitaxy or other process, a gain region, and a second mirror stack. If the second mirror stack is considered the first mirror of a subsequent deposition of the thermo-optic filter described above, then a thin film semiconductor may be direct deposited onto the wafer at a spacer layer, followed by a thin film (HL) final (third overall) mirror stack, as for the free standing filter. Then the laser device will consist of two coupled cavities, one the laser as such and the other a thermally tunable output mirror. The whole device may then be tuned in output wavelength.

Using non-VCSEL lasers of various types, an external cavity tunable laser may be constructed by coupling a laser with only one cavity mirror into a think film tunable filter which also has only the output mirror. The laser system then consists essentially of mirror-gain medium-tunable spacer layer-mirror, and will be tunable in wavelength by thermal control of the spacer layer.

Polarization Control

In order to compensate for polarization mode dispersion, there is a need in WDM networks for polarization sensing and control. A thin film polarizer consists of a thin film filter placed at an angle of incidence to the incoming light, so that the S polarization is primarily transmitted and the P polarization primarily reflected, or vice versa.

Figure 18:
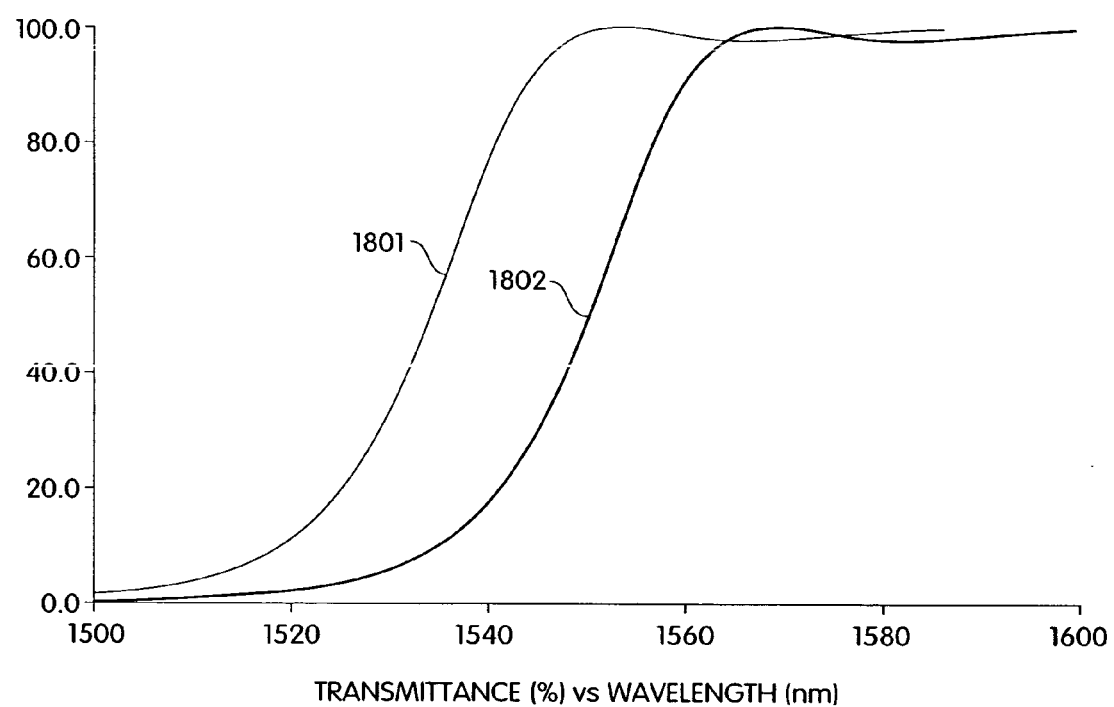
FIG. 18 is a graph illustrating a polarization control filter response.

FIG. 18 shows the P transmittance of a filter illuminated at 56.5°, in two conditions 1801, 1802. The filter consists of 43 layers of two materials, 21 layers designated H=CDS and 22 layers designated L=SiO2. The two curves 1801, 1802 show the effect of varying the H layer index by 2%, to simulate a thermo-optic effect throughout all 21 H layers. Such an effect could be caused by external heating, rather than current in the layers. With this index modulation the P transmittance at 1550 nm varies from 99% for characteristic 1801 to 50% for characteristic 1802.

Figure 19:
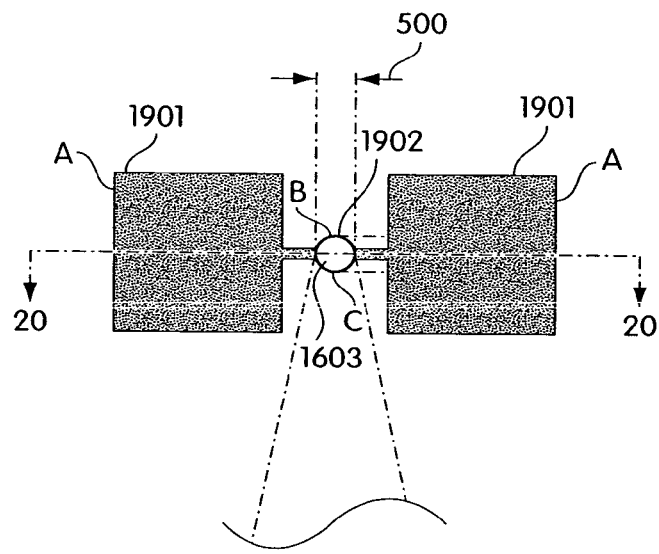
FIG. 19 is a plan view of one resistive heater layout.
Figure 20:
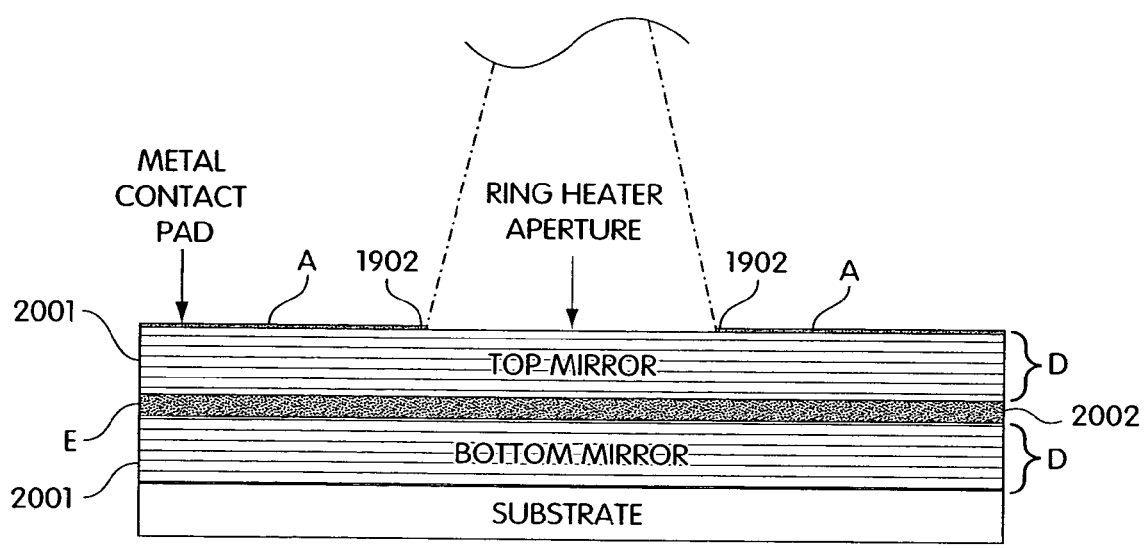
FIG. 20 is a cross sectional view of the layout of FIG. 19, taken along line 20—20.

FIG. 19 shows one possible layout for a tunable thin-film Fabry-Perot filter. Metal pads 1901 allow external electrical contact to a thin-film metallic ring-shaped resistor 1902, which heats the filter 1903. The ring-shaped resistor 1902 may be about 300–500 μm in diameter, or any other suitable size. FIG. 20 shows the filter of FIG. 19 in cross section through line 20—20. The structure includes dielectric thin-film mirror stacks 2001, the Fabry-Perot cavity layer 2002, which in this case is the thermally tunable material, and resistive ring 1902.

By running a current through the resistive heater 1902 using contact pads 1901, resistive heat is generated, which will change the optical properties of the cavity layer, and thus tunes the filter. Light travels through the hole at the center of the resistive heater 1902, which is the active filter area. This type of heater could be made of any material capable of carrying enough current to generate the necessary heat. For example, a ring-shaped heater with a 300 μm diameter, 50 μm wide, made of a 100 nm thick film of chromium would have a resistance of approximately 10 Ohm. The resistive power dissipated is given by $P=I^2R$. Assuming 1 mW is needed to heat the filter sufficiently to have the desired tuning range, a voltage of 3.2 V across the heating element would be generate 0.32 mA and 1 mW of power. This whole device, as well as all the device structures with resistive heating elements discussed below, can be mounted on a heat sink attached to a T/E cooler held at a constant, low temperature, which would provide cooling.

This method of heating is more efficient than the external heater described above because the heating element is in closer proximity to the active layer. This will lead to faster heating and tuning, and less power consumption. Also, a heating element of this type has no fundamental temperature limit, unless the material of the element itself is not stable with temperature. However, there may be poor temperature uniformity across the filter's area because heat must be transferred from the inner edge of the heater to the center of the active filter area. This non-uniform temperature distribution will lead to a broad transmission peak because the beam will be distributed among a range of different cavity properties.

Figure 21:
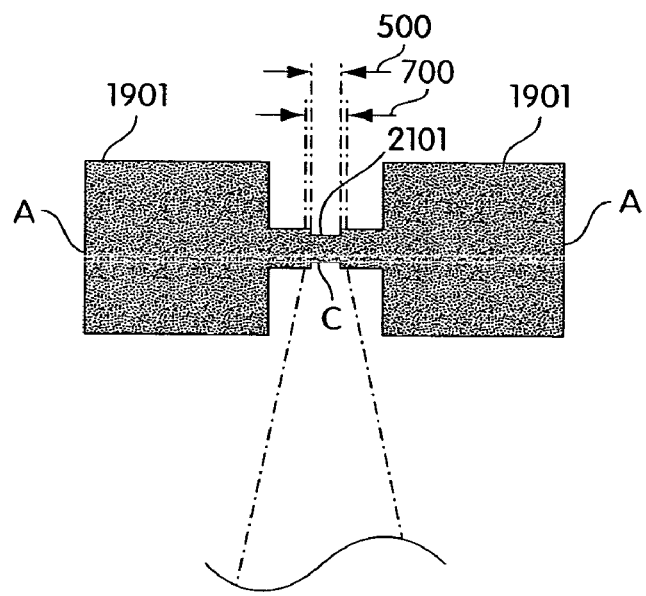
FIG. 21 is a plan view of another resistive heater layout.
Figure 22:
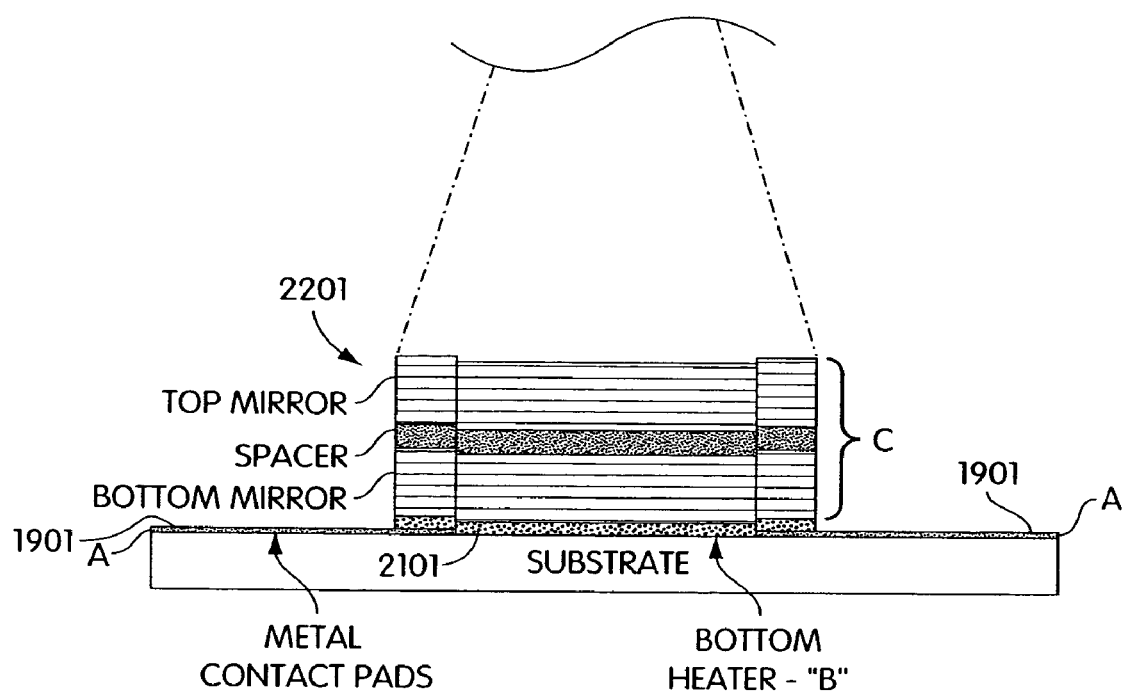
FIG. 22 is a cross sectional view of the layout of FIG. 21, taken along line 22—22.

Alternatively, as shown in FIGS. 21 and 22, a thin-film resistive heater 2101 transparent to the wavelengths of interest could be used. In this case, it could be positioned in the path of the light, providing more uniform heating. FIG. 21 shows a tunable thin-film Fabry-Perot filter with this type of heating element integrated between the substrate and filter stack. This structure also includes metal pads 1901 for making electrical contact to the heating element 2101 and a filter stack 2201. A heating element 2101 of this type for application in the telecommunications industry could be made of one of several transparent conductors, such as zinc oxide, indium tin oxide, a doped thin film of amorphous, micro-crystalline, or poly-crystalline semiconductor, etc. Because these transparent conductors have higher resistivities than most pure metals, the heating element 2101 can be made very small to maximize the resistive power density, for example about 500 μm×500 μm, or any other suitable size.

Another possible material for a semi-transparent resistive heater is a doped crystalline silicon or some other semiconductor crystal. In this case, the filter substrate would be the crystalline semiconductor wafer, and the filter would be fabricated on top of a doped area. Of course, the semiconductor, both intrinsic and doped, must be transparent to the wavelengths of interest through the Fabry-Perot filter. Therefore there will be no unnecessary loss or modification to the optical signal.

Additional heater arrangements are shown FIGS. 23–30. The elements are those already explained in connection with FIGS. 19–22, arranged as shown.

Figure 23:
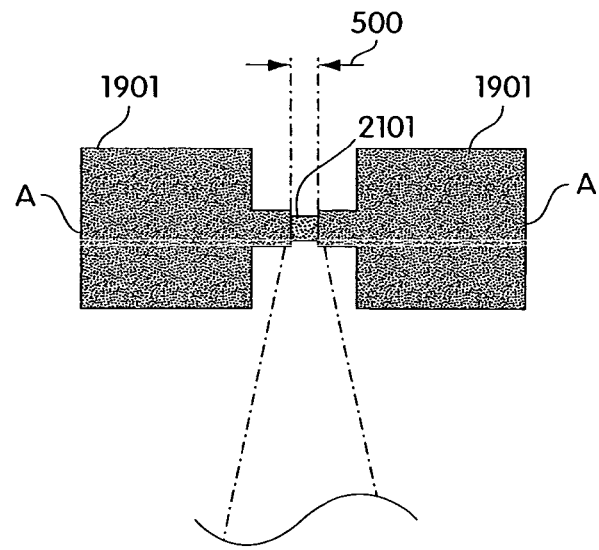
FIG. 23 is a plan view of another resistive heater layout.
Figure 24:
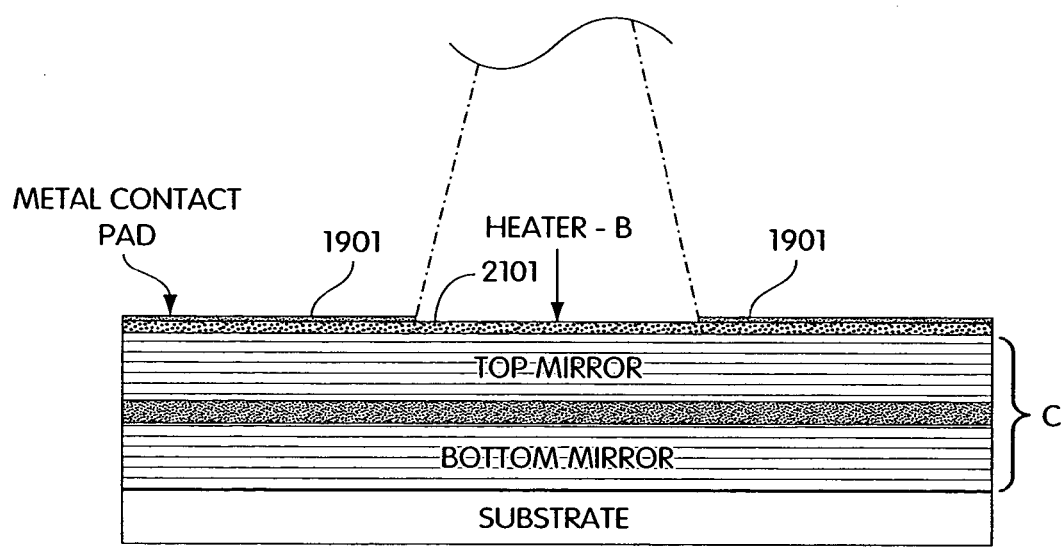
FIG. 24 is a cross sectional view of the layout of FIG. 23, taken along line 24—24.
Figure 25:
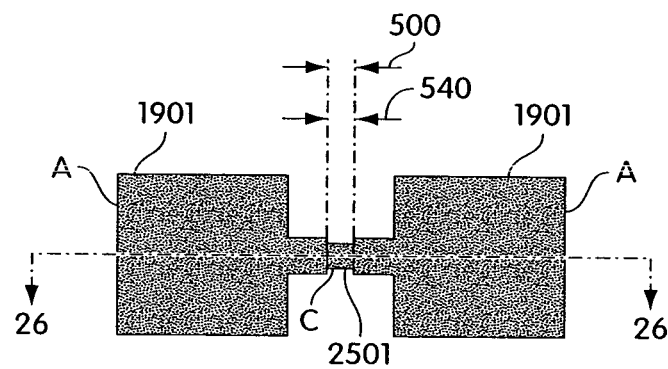
FIG. 25 is a plan view of another resistive heater layout.
Figure 26:
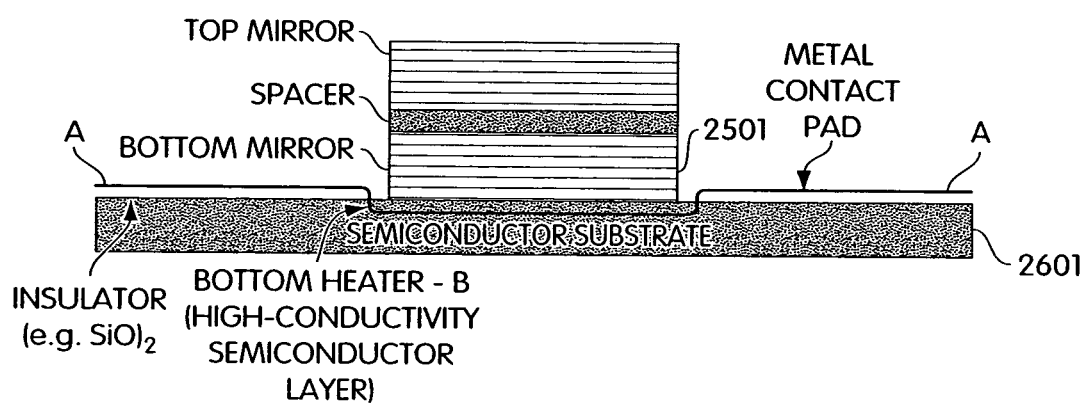
FIG. 26 is a cross sectional view of the layout of FIG. 25, taken along line 25—25.
Figure 27:
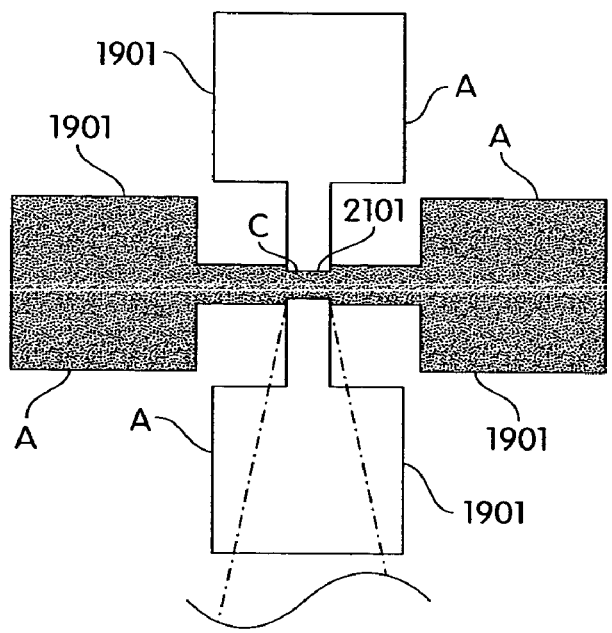
FIG. 27 is a plan view of another resistive heater layout.
Figure 28:
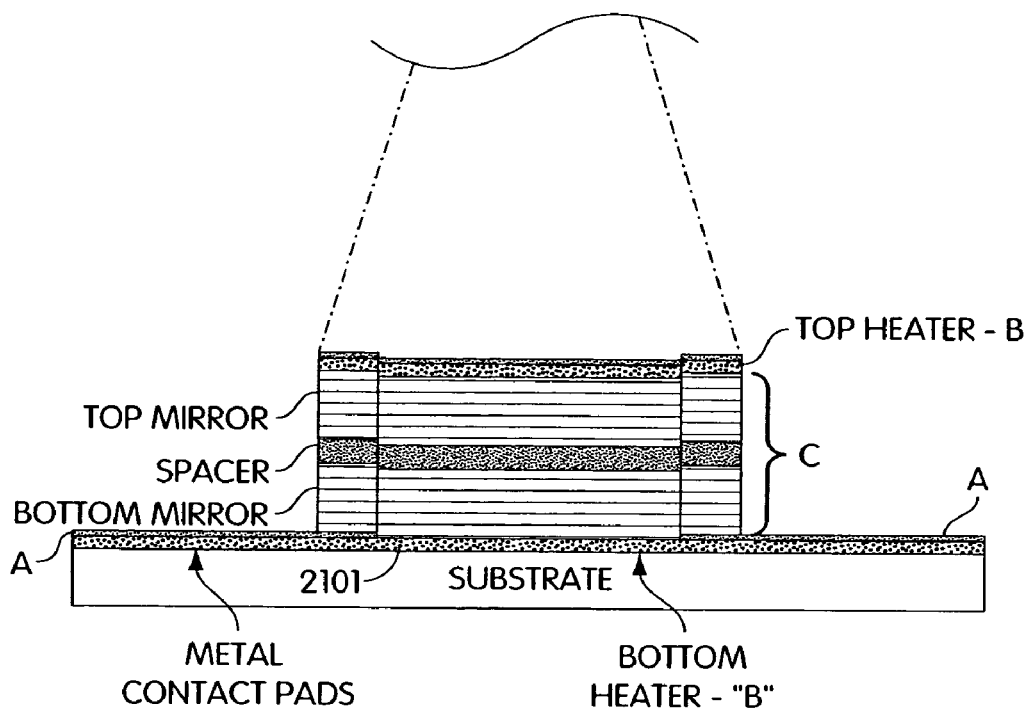
FIG. 28 is a cross sectional view of the layout of FIG. 27, taken along line 27—27.
Figure 29:
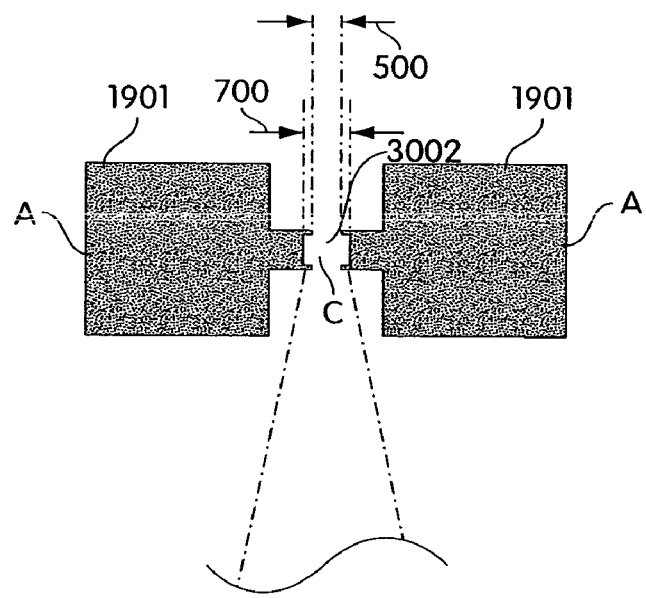
FIG. 29 is a plan view of another resistive heater layout.
Figure 30:
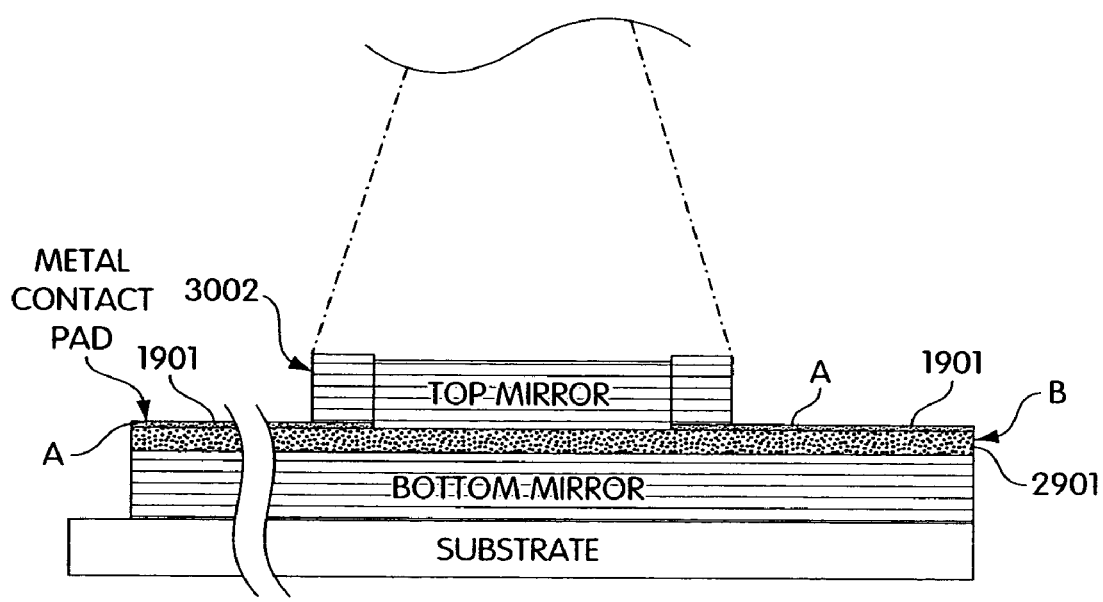
FIG. 30 is a cross sectional view of the layout of FIG. 29, taken along line 29—29.

For example, the structure of FIGS. 23 and 24 is similar to that of FIGS. 21 and 22, but with resistive layer 2101 on top rather than the bottom of the stack. FIGS. 25 and 26 show the resistive layer 2501 as a doped region of substrate 2601. FIGS. 27 and 28 show a combination of the structures of FIGS. 21–24, with top and bottom heaters 2101. Finally, FIGS. 29–30 show the use of spacer layer 2901 as a self-heater. Note that top mirror 3002 has reduced size to allow for contacts 1901 to rest on the spacer layer 2901, making contact thereto.

The present invention has now been described in connection with a number of specific embodiments thereof. However, numerous modifications, which are contemplated as falling within the scope of the present invention, should now be apparent to those skilled in the art. Therefore, it is intended that the scope of the present invention be limited only by the scope of the claims appended hereto.

What is claimed is:

1. A multi-cavity thin-film interference filter comprising a sequence of alternating layers of amorphous silicon and a dielectric material deposited one on top of the other to form a tunable bandpass filter, said dielectric material being selected from the group consisting of silicon dioxide and silicon nitride, said sequence of alternating layers forming coupled Fabry-Perot cavity structures including at least a first Fabry-Perot cavity structure and a second Fabry-Perot cavity structure, each of said first and second Fabry-Perot cavity structures comprising:
   a first multi-layer thin film interference structure forming a first mirror;
   a thin-film spacer layer deposited on a top surface of the first multi-layer thin-film interference structure, said thin-film spacer layer made of said amorphous silicon; and
   a second multi-layer thin film interference structure deposited on a top surface of the thin-film spacer layer and forming a second mirror;
   wherein said multi-cavity filter further comprises:
   a layer of electrically conductive material to which, during use, power is supplied by an external source to change the temperature of the multi-cavity thin film interference filter and thereby shift the passband of the multi-cavity thin film interference filter; and
   a substrate on which the first multi-layer thin film interference structure of the first Fabry-Perot cavity structure is deposited, wherein said layer of electrically conductive material forms a ring heater on the substrate and circumscribing an optical path through the first and second Fabry-Perot cavity structures.

2. The multi-cavity thin film interference filter of claim 1, wherein the dielectric material is silicon nitride.

3. A multi-cavity thin-film interference filter comprising a sequence of alternating layers of amorphous silicon and a dielectric material deposited one on top of the other to form a tunable bandpass filter, said dielectric material being selected from the group consisting of silicon dioxide and silicon nitride, said sequence of alternating layers forming coupled Fabry-Perot cavity structures including at least a first Fabry-Perot cavity structure and a second Fabry-Perot cavity structure, each of said first and second Fabry-Perot cavity structures comprising:
   a first multi-layer thin film interference structure forming a first mirror;
   a thin-film spacer layer deposited on a ton surface of the first multi-layer thin-film interference structure, said thin-film spacer layer made of said amophous silicon; and
   a second multi-layer thin film interference structure deposited on a top surface of the thin-film spacer layer and forming a second mirror;
   wherein said multi-cavity filter further comprises:
   a layer of electrically conductive material to which, during useaower is supplied by an external source to change the temperature of the multi-cavity thin film interference filter and thereby shift the passband of the multi-cavity thin film interference filter; and
   a crystalline semiconductor substrate on which the first multi-layer thin film interference structure of the first Fabry-Perot cavity structure is deposited, wherein said layer of electrically conductive material is a doped upper region of said substrate.

4. The multi-cavity thin film interference filter of claim 3, wherein the dielectric material is silicon nitride.

* * * * *

UNITED STATES PATENT AND TRADEMARK OFFICE
CERTIFICATE OF CORRECTION

PATENT NO. : 7,049,004 B2
APPLICATION NO. : 10/666974
DATED : May 23, 2006
INVENTOR(S) : Domash et al.

Page 1 of 1

It is certified that error appears in the above-identified patent and that said Letters Patent is hereby corrected as shown below:

Column 22, line 13 should read as follows:
Replace: "on a ton surface" with --on a top surface--

Column 22, line 15 should read as follows:
Replace: "said amophous silicon" with --said amorphous silicon--

Column 22, line 22 should read as follows:
Replace: "during useaower" with --during use, power--

Signed and Sealed this

Twenty-second Day of August, 2006

JON W. DUDAS
*Director of the United States Patent and Trademark Office*